(12) United States Patent
Ohkawa

(10) Patent No.: US 7,492,047 B2
(45) Date of Patent: Feb. 17, 2009

(54) SEMICONDUCTOR DEVICE AND ITS MANUFACTURE METHOD

(75) Inventor: Narumi Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 54 days.

(21) Appl. No.: 11/116,424

(22) Filed: Apr. 28, 2005

(65) Prior Publication Data

US 2005/0242402 A1 Nov. 3, 2005

Related U.S. Application Data

(63) Continuation of application No. PCT/JP03/05456, filed on Apr. 28, 2003.

(51) Int. Cl.
*H01L 23/48* (2006.01)
*H01L 23/52* (2006.01)
*H01L 29/40* (2006.01)

(52) U.S. Cl. .............................. 257/774; 257/E23.011

(58) Field of Classification Search ........................ None
See application file for complete search history.

(56) References Cited

U.S. PATENT DOCUMENTS

| | | | |
|---|---|---|---|
| 5,705,849 A * | 1/1998 | Zheng et al. | 257/530 |
| 5,990,011 A * | 11/1999 | McTeer | 438/692 |
| 6,005,291 A | 12/1999 | Koyanagi et al. | |
| 6,043,561 A * | 3/2000 | Katori et al. | 257/751 |
| 6,051,867 A * | 4/2000 | Theil et al. | 257/444 |
| 6,242,808 B1 * | 6/2001 | Shimizu et al. | 257/762 |
| 6,277,737 B1 * | 8/2001 | Sandhu et al. | 438/654 |
| 6,534,864 B1 * | 3/2003 | Tanaka et al. | 257/751 |
| 6,764,945 B2 | 7/2004 | Ashihara et al. | |
| 7,088,001 B2 | 8/2006 | Ashihara et al. | |
| 2001/0000115 A1 * | 4/2001 | Greco et al. | 257/773 |
| 2001/0039061 A1 * | 11/2001 | Suzuki et al. | 438/1 |
| 2002/0098670 A1 | 7/2002 | Ashihara et al. | |

FOREIGN PATENT DOCUMENTS

| | | |
|---|---|---|
| JP | 05-114578 A | 5/1993 |
| JP | 05-234935 A | 9/1993 |
| JP | 6-29292 | 2/1994 |

(Continued)

OTHER PUBLICATIONS

Korean Office Action dated Sep. 29, 2006, issued in corresponding Korean Patent Application No. 10-2005-7009149.

(Continued)

*Primary Examiner*—Evan Pert
*Assistant Examiner*—Ben P Sandvik
(74) *Attorney, Agent, or Firm*—Westerman, Hattori, Daniels & Adrian, LLP.

(57) ABSTRACT

The present invention relates to a semiconductor device which comprises a plug layer which is embedded in a window penetrating an inter-layer insulation film, and flattened by using a chemical mechanical polishing, a titanium Ti film which is deposited to extend from the inter-layer insulation film to the plug layer, a titanium nitride TiN film which is deposited on the Ti film, a wiring layer which contains aluminum Al or copper Cu deposited on the TiN film, and an underlying film which is formed between the inter-layer insulation layer and the Ti film.

16 Claims, 21 Drawing Sheets

2ND OR SUBSEQUENT LAYER

1ST LAYER

FOREIGN PATENT DOCUMENTS

| | | |
|---|---|---|
| JP | 07-297136 A | 11/1995 |
| JP | 09-232429 A | 9/1997 |
| JP | 09-326490 | 12/1997 |
| JP | 11-067907 A | 3/1999 |
| JP | 11-271985 | 8/1999 |
| JP | 2000-49115 | 2/2000 |
| JP | 2000-114376 | 4/2000 |
| JP | 2001-24059 A | 1/2001 |
| JP | 2001-176875 | 6/2001 |
| JP | 2002-217292 A | 8/2002 |
| KR | 1020010066121 A | 7/2001 |

OTHER PUBLICATIONS

Japanese Office Action issued on Sep. 16, 2008 for corresponding Japanese Patent Application No. 2004-571296.

* cited by examiner

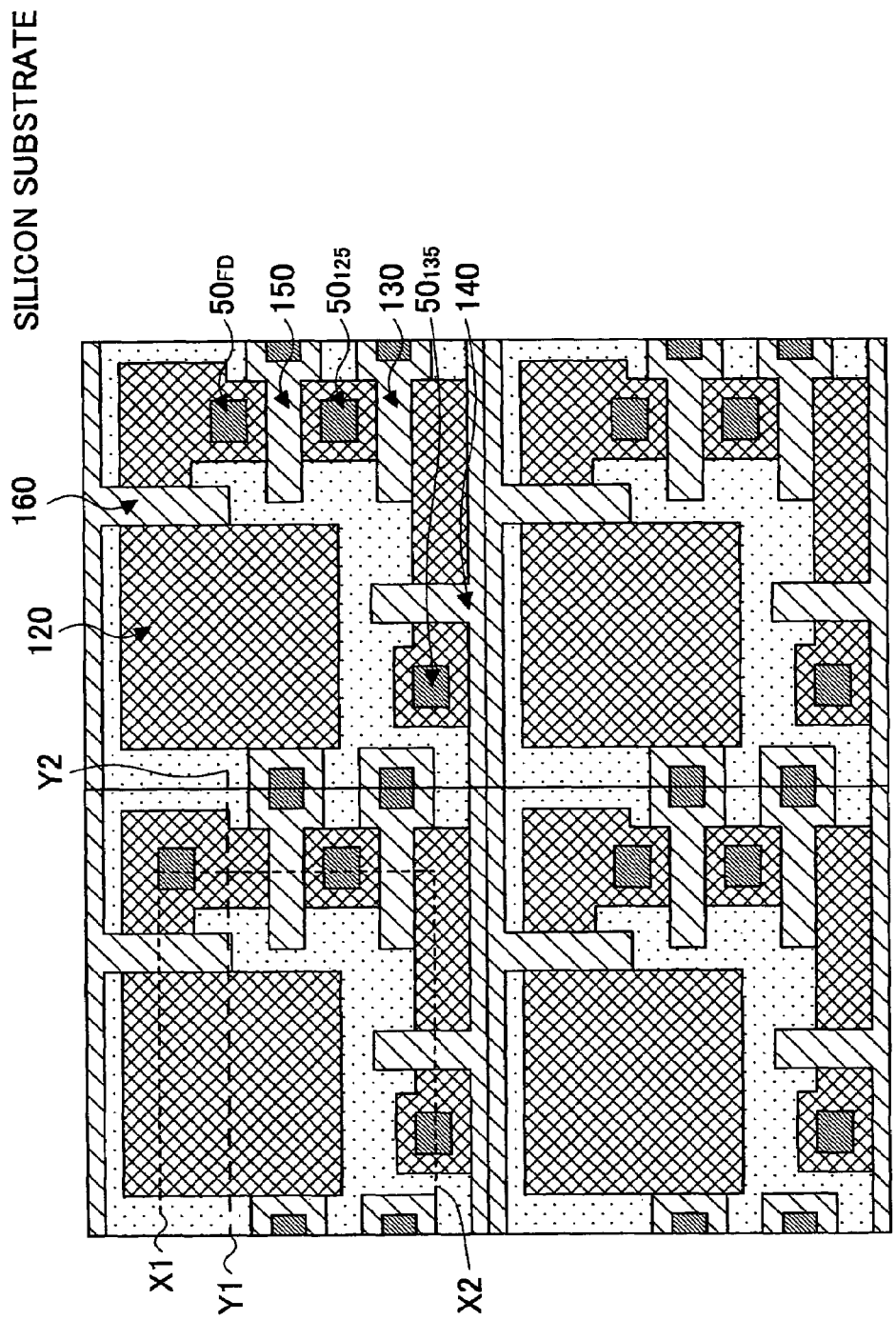

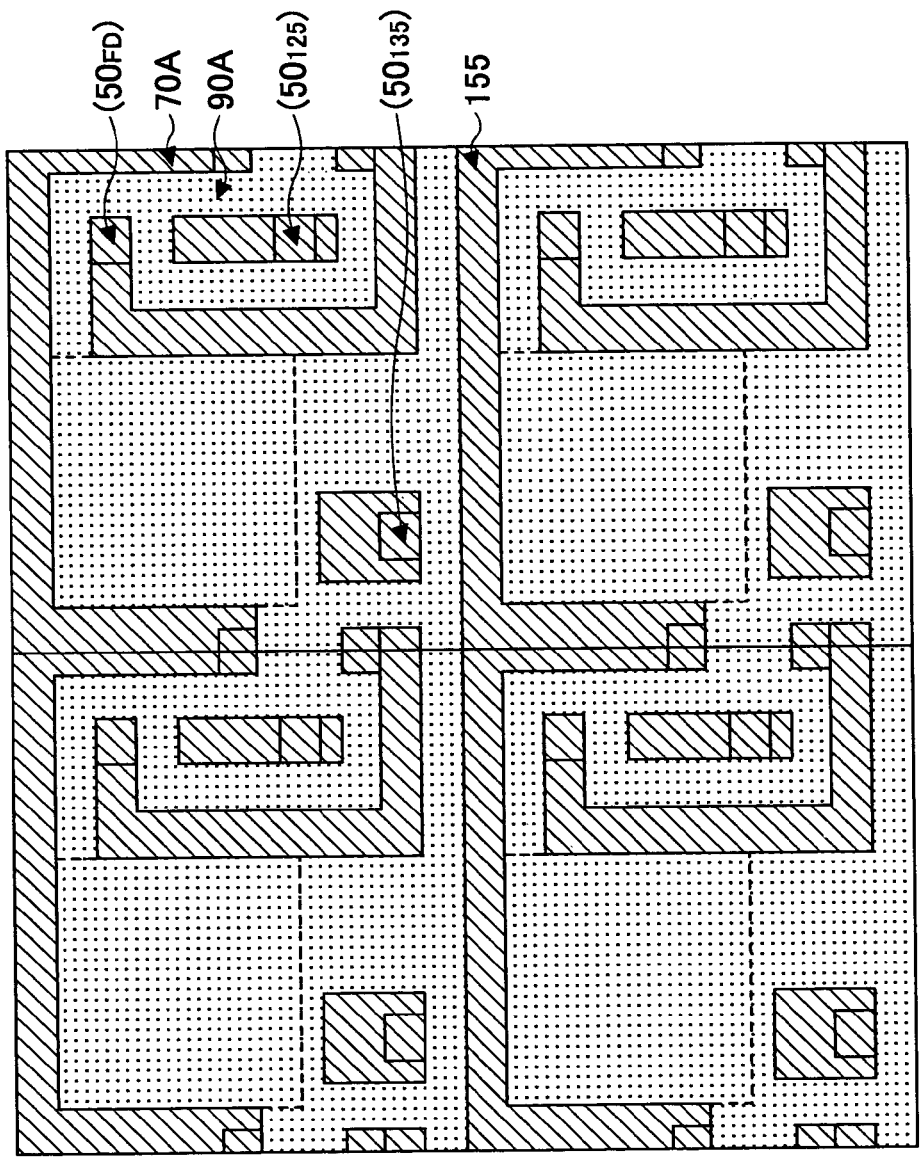

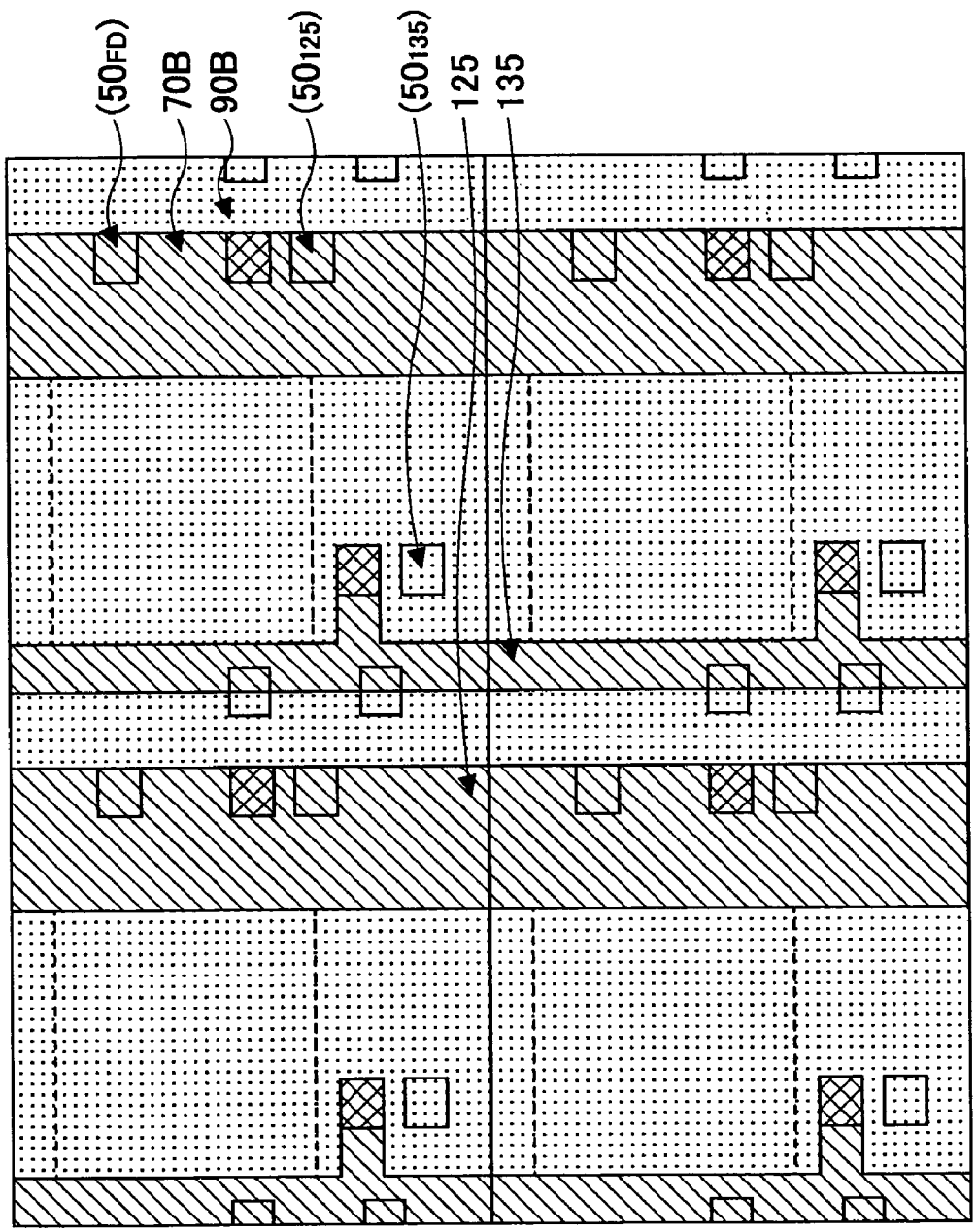

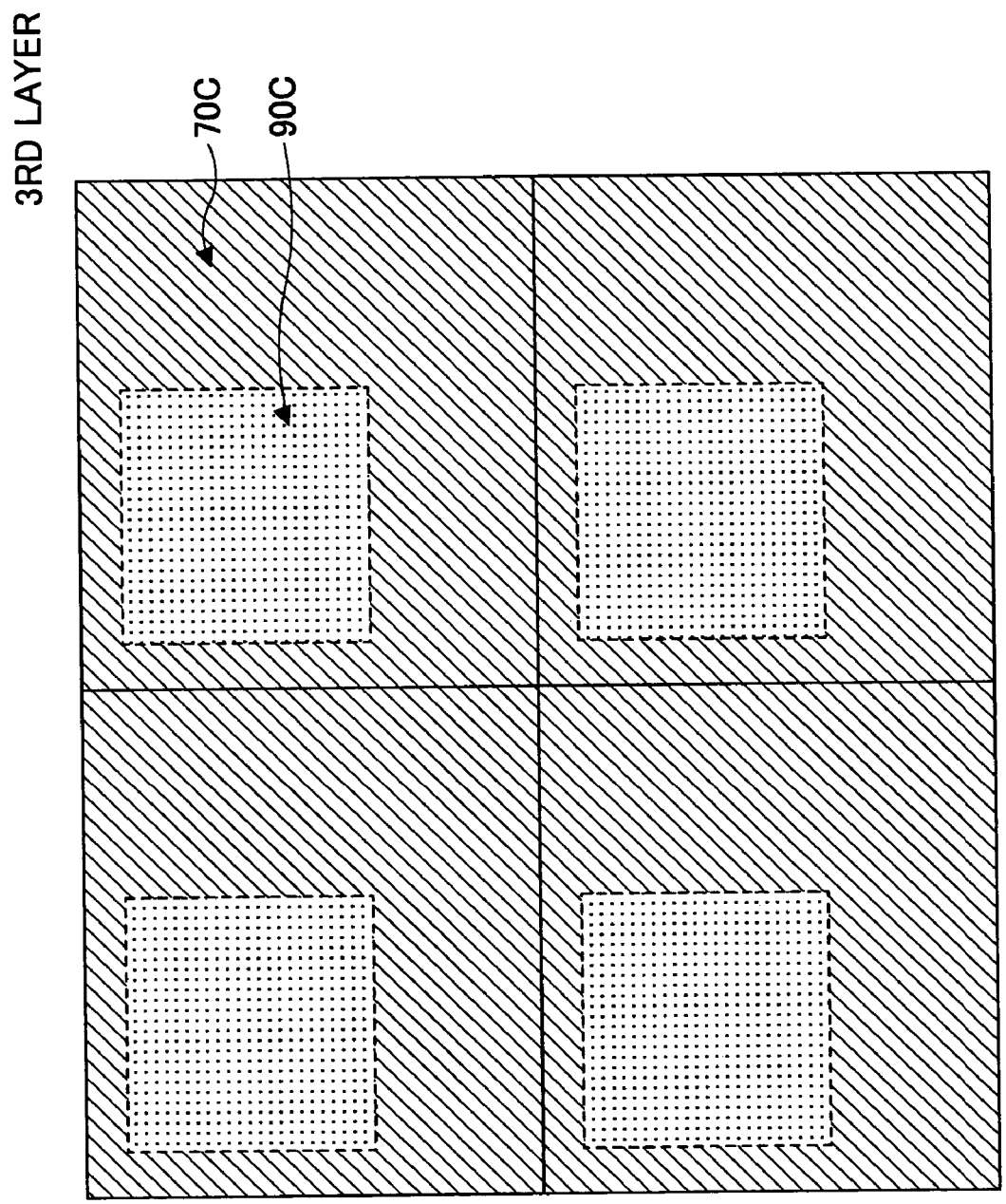

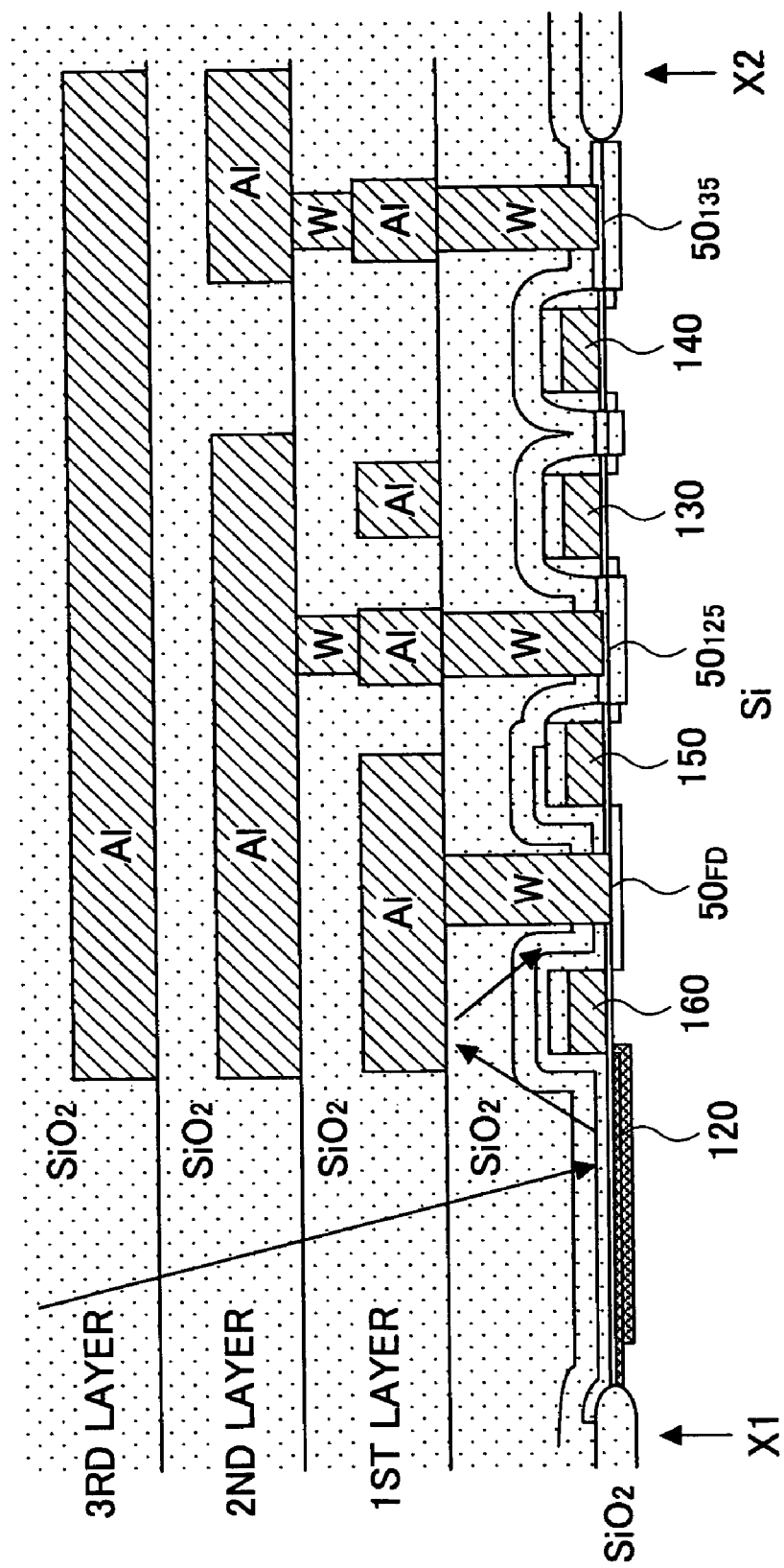

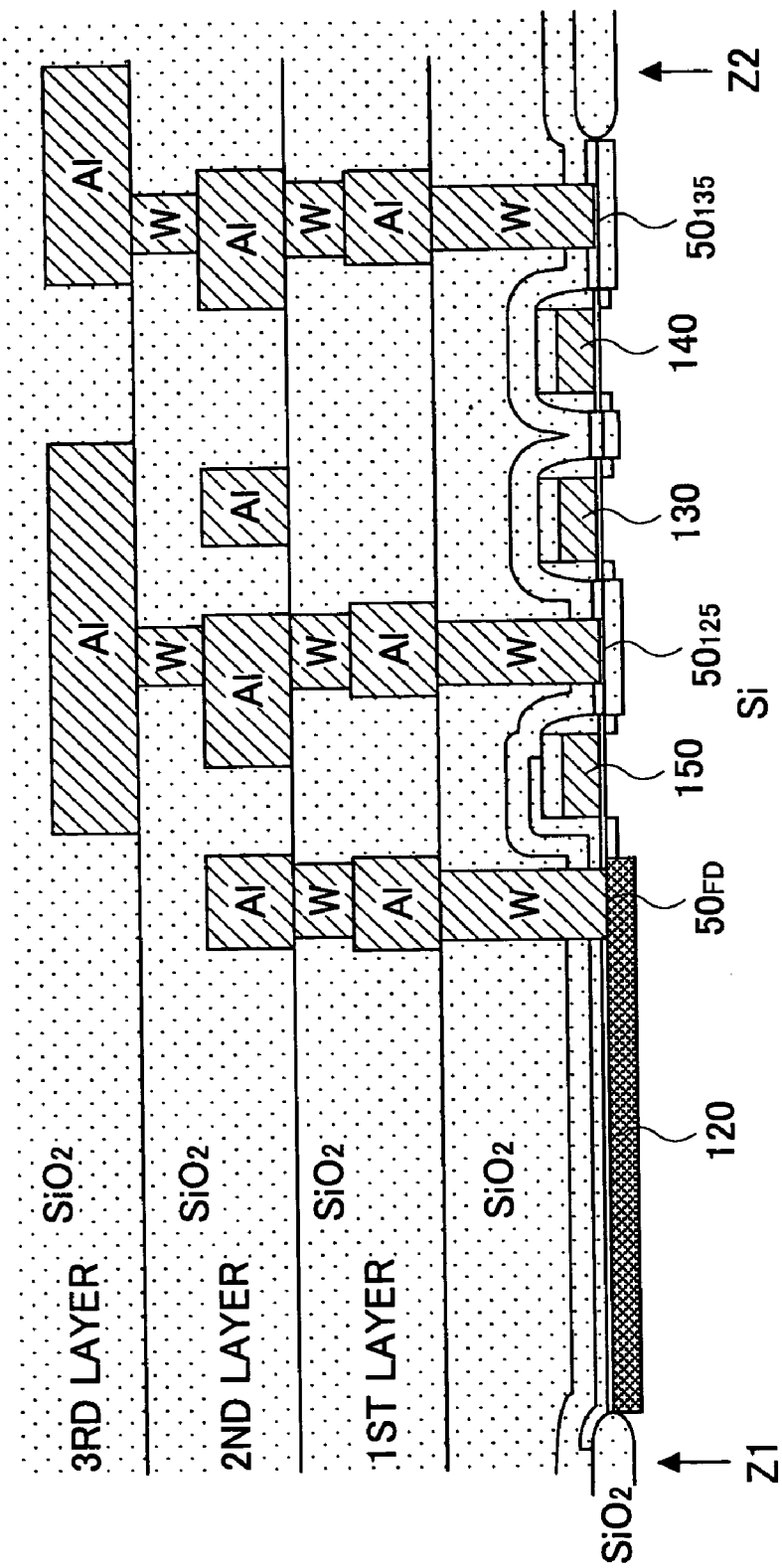

US 7,492,047 B2

SEMICONDUCTOR DEVICE AND ITS MANUFACTURE METHOD

CROSS-REFERENCE TO RELATED APPLICATION

This application is a U.S. continuation application which is filed under 35 USC 111(a) and claims the benefit under 35 USC 120 and 365(c) of International Application No. PCT/JP2003/005456, filed on Apr. 28, 2003, the entire contents of which are hereby incorporated by reference.

BACKGROUND OF THE INVENTION

1. Field of the Invention

The present invention relates to the semiconductor device and its manufacture method, and more particularly to the semiconductor device which is a CMOS (complementary metal oxide semiconductor) image sensor and its manufacture method.

2. Description of the Related Art

The CMOS image sensors and the CCD (charge-coupled device) image sensors are known widely as the image sensors. Generally, the CMOS image sensors provide poor image quality when compared with the CCD image sensors, but because of low power consumption and small size, the CMOS image sensors are widely used for the portable telephones or the like.

The unit pixel of the CMOS image sensor generally comprises one photo diode and three or four transistors. FIG. 1A shows the unit pixel 110 of the three transistor type CMOS image sensor 100, and FIG. 1B shows the unit pixel 110 of the four transistor type CMOS image sensor 100. The former comprises the photo diode (PD) 120, the source-follower transistor (SF-TR) 130, the selection transistor (SCT-TR) 140, and the reset transistor (RST-TR) 150, and the latter further comprises the transfer transistor (TF-TR) 160.

The PD 120 creates the signal charge by the photoelectric conversion, and the SF-TR 130 transforms the signal charge into the signal voltage. The SCT-TR 140 is used to select the unit pixel 110, the RST-TR 150 is used to reset the PD 120, and the TF-TR 160 is used to transfer the signal charge from the PD 120 to the SF-TR 130.

The PD 120 is connected to the reset voltage line 125 through the RST-TR 150, and the SF-TR 130 is connected to the signal-voltage read-out line 135 through the SCT-TR 140. The SCT-TR 140 is connected to the selection line 145, the RST-TR 150 is connected to the reset line 155, and the TF-TR 160 is connected to the transfer line 165.

In the case of the CMOS image sensor, the N+P junction is used as the photo diode, and it is necessary to suppress junction leak generated in the interface level of the Si/SiO2 oxide-film interface. For this reason, in many cases, by forming the P+shield layer near the surface of the silicon Si substrate, and making it the P+NP embedded diode structure, the Si/SiO2 oxide-film interface and the depletion layer are separated, so that the junction leak is suppressed.

However, there is the problem that it is difficult to separate the Si/SiO2 oxide-film interface and the depletion layer completely. For this reason, in many cases, by performing the H2 annealing in the last stage of the wafer process, the interface level of the Si/SiO2 oxide-film interface created by the damage in the wafer process is reduced, so that the junction leak is suppressed. However, the H2 annealing has the following problem concerning the wiring structure of the CMOS image sensor.

FIG. 2 and FIG. 3 are cross-sectional views showing the principal part of the conventional CMOS image sensor and for explaining the manufacture method. Specifically, FIG. 2 shows the conventional method of forming the multi-layer wiring structure using the CMP (chemical mechanical polishing), and FIG. 3 shows the conventional method of forming the multi-layer wiring structure using the dry etch back.

The left diagrams of each figure show the wiring structure of the 2nd or subsequent layer from the bottom, the right diagrams of each figure show the wiring structure of the 1st layer from the bottom, and the flow of each diagrams A, B, and C is equivalent to the flow of the process of forming the wiring structure.

When aluminum (Al) is used as the material of the wiring layer, as indicated in FIG. 2 C and FIG. 3 C, the wiring structure which is adopted in many cases comprises, from the bottom, the Ti (titanium) film 60, the TiN (titanium nitride) film 65, the aluminum (Al) wiring layer 70, the Ti (titanium) film 80, and the TiN (titanium nitride) film 85 (the thickness of which is, in this order, about 20 nm, about 50 nm, 0.3-1.0 micrometer, about 5 nm, and about 100 nm).

The purpose of the wiring structure is to raise the stress resistance, such as electro-migration, by controlling the crystal stacking tendency of aluminum by the use of Ti. When forming such wiring structure, the CMP may be used as shown in FIGS. 2 A and B, and the dry etch back may be used as shown in FIGS. 3 A and B.

Concerning the 2nd or subsequent layer when using the CMP, as in the left diagram of FIG. 2 A, the inter-layer insulating film 30 of SiO2 is deposited on the lower layer wiring structure 20, and the via hole (window) 21 which penetrates the inter-layer insulating film 30 of SiO2 is formed. The TiN (titanium nitride) film 45 (the thickness is about 50 nm) is deposited on the inter-layer insulating film 30 of SiO2, the W (tungsten) plug layer 50 is embedded in the via hole 21, and the W plug layer 50 is flattened by the CMP as in the left diagram of FIG. 2 B.

Concerning the 1st layer, as in the right diagram of FIG. 2 A, the inter-layer insulating film 30 of SiO2 is deposited on the Si substrate 10 in which the pixels etc. are created, and the contact hole (window) 11 which penetrates the inter-layer insulating film 30 of SiO2 is formed. After the Ti (titanium) film 40 (the thickness about 20 nm) is deposited on the inter-layer insulating film 30 of SiO2, the TiN (titanium nitride) film 45 (the thickness about 50 nm) is deposited, the W (tungsten) plug layer 50 is embedded in the contact hole 11, and the W plug layer 50 is flattened by the CMP as in the right diagram of FIG. 2 B.

If the CMP is used, for either the 1st layer or the 2nd or subsequent layer, the undersurface of the Ti film 60 is exposed to the inter-layer insulating film 30 of SiO2 as in the diagrams of FIG. 2 C. This will adversely affect the H2 annealing. That is, although H2 should pass each inter-layer insulating film of SiO2 and reach the Si/SiO2 oxide-film interface, it will be absorbed by the Ti film 60 in the inter-layer insulating film 30 of SiO2 at the intermediate location.

For this reason, the interface level of the Si/SiO2 oxide-film interface is not fully reduced and the junction leak is not fully suppressed. There is the problem that the quality of image is degraded. This problem is so serious that the area of the undersurface of the Ti film 60 becomes large.

When the dry etch back is used instead of the CMP, concerning the second or subsequent layer as in the left diagram of FIG. 3 B, the portion 46 of the TiN film 45 deposited on the inter-layer insulating film 30 of SiO2 remains without being removed by the dry etch back, and it is avoided that the undersurface of the Ti film 60 is exposed to the inter-layer insulating film 30 of SiO2.

However, concerning the 1st layer as in the right diagram of FIG. 3B, the portion 41 of the Ti film 40 deposited on the inter-layer insulating film 30 of SiO2 also remains without being removed by the dry etch back, and instead of the Ti film 60, the undersurface of the Ti film 40 will be exposed to the inter-layer insulating film 30 of SiO2.

For this reason, the interface level of the Si/SiO2 oxide-film interface is not fully reduced and the junction leak is not fully suppressed. There is the problem that the quality of image is degraded. This problem is so serious that the area of the undersurface of the Ti film 40 becomes large.

Furthermore, concerning either the 1st layer or the 2nd or subsequent layer, there is the problem that the recess 51 of the W plug layer 50 is created by the dry etch back as in the diagram of FIG. 3 B.

In addition, Japanese Patent No. 3021683, Japanese Laid-Open Patent Application No. 07-263546, Japanese Laid-Open Patent Application No. 08-293552, Japanese Laid-Open Patent Application No. 08-340047, Japanese Laid-Open Patent Application No. 09-326490, Japanese Laid-Open Patent Application No. 10-022390, Japanese Laid-Open Patent Application No. 2000-260863, and Japanese Laid-Open Patent Application No. 2002-050595 disclose the background technology relevant to the present invention.

SUMMARY OF THE INVENTION

An object of the present invention is to provide a semiconductor device in which the wiring structure is formed using the chemical mechanical polishing and the adverse affecting of the Ti film on the H2 annealing is suppressed.

In order to achieve the above-mentioned object, the present invention provides a semiconductor device comprising: a plug layer which is embedded in a window penetrating an inter-layer insulation film, and flattened by using a chemical mechanical polishing; a titanium Ti film which is deposited to extend from the inter-layer insulation film to the plug layer; a wiring layer which contains aluminium Al or copper Cu deposited on the Ti film; and an underlying film which is formed between the inter-layer insulation layer and the Ti film.

According to the above-mentioned semiconductor device, the undersurface of the underlying film which does not penetrate H2 (hydrogen) is exposed to the inter-layer insulation film, instead of the Ti film, and the adverse affecting of the Ti film on the H2 annealing can be suppressed in the semiconductor device in which the wiring structure is formed using the chemical mechanical polishing.

The above-mentioned semiconductor device may be configured so that the underlying film is a TiN (titanium nitride) film or a SiN (silicon nitride) film. According to the present invention, instead of the Ti film, the undersurface of the TiN film or the SiN film is exposed to the inter-layer insulation film, and the adverse affecting of the Ti film on the H2 annealing can be suppressed in the semiconductor device in which the wiring structure is formed using the chemical mechanical polishing.

The above-mentioned semiconductor device may be configured so that the underlying film is penetrated by the window. The above-mentioned semiconductor device may be configured so that the underlying film is formed between the window and the plug layer. The above-mentioned semiconductor device may be configured so that the underlying film is formed between the plug layer and the Ti film.

The above-mentioned semiconductor device may be configured so that the semiconductor device further comprises a TiN (titanium nitride) sidewall covering a side surface of the Ti film. According to the present invention, the side surface of the Ti film is covered by the TiN sidewall, and the adverse affecting of the Ti film on the H2 annealing can be suppressed further in the semiconductor device in which the wiring structure is formed using the chemical mechanical polishing.

The above-mentioned semiconductor device may be configured so that the wiring layer is an uppermost wiring layer or a lowermost wiring layer in a multi-layer wiring structure. According to the present invention, the undersurface of the underlying film which does not penetrate H2 (hydrogen) is exposed to the inter-layer insulation film, instead of the Ti film, with respect to the uppermost wiring layer in which the area of the undersurface of the Ti film becomes large, and the adverse affecting of the Ti film on the H2 annealing can be suppressed further in the semiconductor device in which the wiring structure is formed using the chemical mechanical polishing.

Another object of the present invention is to provide a semiconductor device in which the wiring structure is formed using the dry etch back and the adverse affecting of the Ti film on the H2 annealing is suppressed.

In order to achieve the above-mentioned object, the present invention provides a semiconductor device comprising a plug layer which is embedded in a window penetrating an inter-layer insulation film, and flattened by using a dry etch back; and a wiring layer which contains aluminium Al or copper Cu laid only on the plug layer and not laid on the inter-layer insulation film, wherein the wiring layer is a lowermost wiring layer in a multi-layer wiring structure.

According to the above-mentioned semiconductor device, the undersurface of the Ti film in the lowermost wiring layer which becomes defective when the wiring structure is formed using the dry etch back is not exposed to the inter-layer insulation film, and the adverse affecting of the Ti film on the H2 annealing can be suppressed in the semiconductor device in which the wiring structure is formed using the dry etch back.

The above-mentioned semiconductor device may be configured so that the semiconductor device is a CMOS image sensor.

In order to achieve the above-mentioned object, the present invention provides a semiconductor device comprising a tantalum Ta film or tantalum nitride TaN film deposited on an inter-layer insulation film; and a wiring layer containing copper Cu deposited on the Ta film or the TaN film, wherein the semiconductor device is a CMOS image sensor.

Another object of the present invention is to provide a method of manufacturing a semiconductor device in which the wiring structure is formed using the chemical mechanical polishing and the adverse affecting of the Ti film on the H2 annealing is suppressed.

In order to achieve the above-mentioned object, the present invention provides a method of manufacturing a semiconductor device which comprises the steps of: forming a window which penetrates an inter-layer insulation film; embedding a plug layer in the window; flattening the plug layer by using a chemical mechanical polishing; depositing a titanium Ti film so that the Ti film extends from the inter-layer insulation film to the plug layer; forming a wiring layer containing aluminum Al or copper Cu (copper) deposited on the Ti film; and forming an underlying film between the inter-layer insulation film and the Ti film.

According to the above-mentioned manufacture method, the undersurface of the underlying film which does not penetrate H2 (hydrogen) is exposed to the inter-layer insulation film, instead of the Ti film, and the adverse affecting of the Ti film on the H2 annealing can be suppressed in the method of manufacturing the semiconductor device in which the wiring structure is formed using the chemical mechanical polishing.

The above-mentioned manufacture method may be configured so that the underlying film is a titanium nitride TiN film or a silicon nitride SiN film. According to the present invention, instead of the Ti film, the undersurface of the TiN film or the SiN film is exposed to the inter-layer insulation film, the adverse affecting of the Ti film on the H2 annealing can be suppressed in the manufacture method of the semiconductor device which forms the wiring structure using the chemical mechanical polishing.

The above-mentioned manufacture method may be configured so that the underlying film is penetrated by the window. The above-mentioned manufacture method may be configured so that the underlying film is formed between the window and the plug layer. The above-mentioned manufacture method may be configured so that the underlying film is formed between the plug layer and the Ti film.

The above-mentioned manufacture method may be configured so that the method further comprises the step of forming a titanium nitride TiN sidewall covering a side surface of the Ti film. According to the present invention, the side surface of the Ti film is covered by the TiN sidewall, and the adverse affecting of the Ti film on the H2 annealing can be suppressed further in the semiconductor device in which the wiring structure is formed using the chemical mechanical polishing.

The above-mentioned manufacture method may be configured so that the wiring layer is an uppermost wiring layer or a lowermost wiring layer in a multi-layer wiring structure. According to the present invention, the undersurface of the underlying film which does not penetrate H2 (hydrogen) is exposed to the inter-layer insulation film, instead of the Ti film, with respect to the uppermost wiring layer in which the area of the undersurface of the Ti film becomes large, and the adverse affecting of the Ti film on the H2 annealing can be suppressed further in the semiconductor device in which the wiring structure is formed using the chemical mechanical polishing.

Another object of the present invention is to provide a method of manufacturing a semiconductor device in which the wiring structure is formed using the dry etch back and the adverse affecting of the Ti film on the H2 annealing is suppressed.

In order to achieve the above-mentioned object, the present invention provides a method of manufacturing a semiconductor device which comprises the steps of: forming a window which penetrates an inter-layer insulation film; embedding a plug layer in the window; flattening the plug layer by using a dry etch back; and forming a wiring layer containing aluminum Al or copper Cu laid only on the plug layer and not laid on the inter-layer insulation film, wherein the wiring layer is a lowermost wiring layer in a multi-layer wiring structure.

According to the above-mentioned manufacture method, the undersurface of the Ti film in the lowermost wiring layer which becomes defective when the wiring structure is formed using the dry etch back is not exposed to the inter-layer insulation film, and the adverse affecting of the Ti film on the H2 annealing can be suppressed in the semiconductor device in which the wiring structure is formed using the dry etch back.

The above-mentioned manufacture method may be configured so that the semiconductor device is a CMOS image sensor.

In order to achieve the above-mentioned object, the present invention provides a method of manufacturing a semiconductor device which comprises the steps of: depositing a tantalum Ta film or a tantalum nitride TaN film on an inter-layer insulation film; and forming a wiring layer containing copper Cu deposited on the Ta film or the TaN film, wherein the semiconductor device is a CMOS image sensor.

BRIEF DESCRIPTION OF THE DRAWINGS

Other objects, features and advantages of the present invention will be apparent from the following detailed description when read in conjunction with the accompanying drawings.

FIG. 7A, FIG. 7B, FIG. 7C and FIG. 7D are top views of the CMOS image sensor in the 1st embodiment of the invention.

FIG. 8 is a side view of the CMOS image sensor in the 1st embodiment of the invention.

FIG. 14 is a side view of the CMOS image sensor in the 4th embodiment of the invention.

DETAILED DESCRIPTION OF PREFERRED EMBODIMENTS

A description will now be given of the preferred embodiments of the invention with reference to the accompanying drawings.

The 1st Embodiment

Figure 4:
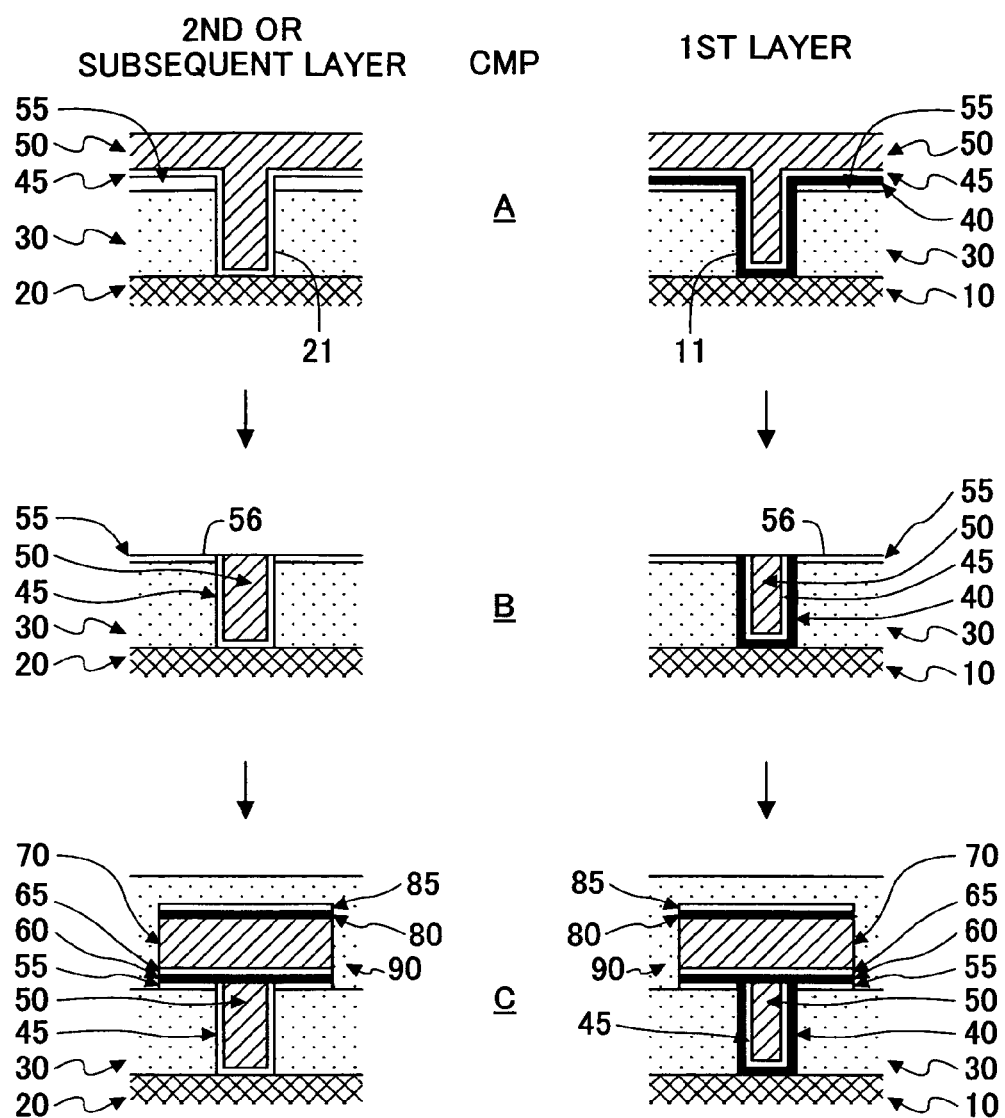
FIG. 4 is a cross-sectional view showing the principal part of the CMOS image sensor in the 1st embodiment of the invention and for explaining the manufacture method.

FIG. 4 shows the principal part of the CMOS image sensor in the 1st embodiment of the invention and the manufacture method. Specifically, FIG. 4 shows an embodiment of the method of forming the multi-layer wiring structure using the CMP (chemical mechanical polishing).

The left diagrams of FIG. 4 show the wiring structure of the 2nd or subsequent layer from the bottom, the right diagrams of FIG. 4 show the wiring structure of the 1st layer from the bottom, and the flow of the diagrams A, B and C of FIG. 4 is equivalent to the flow of the process of forming the wiring structure.

As for the 2nd or subsequent layer, as shown in the left diagram of FIG. 4 A, the inter-layer insulating film 30 of SiO2 is deposited on the lower layer wiring structure 20 by the CVD, and, by the sputtering, the underlying film 55 (the thickness about 150 nm) is deposited directly on the inter-layer insulating film 30 of SiO2. And the via hole (window) 21 which penetrates the inter-layer insulating film 30 of SiO2 and the underlying film 55 is formed.

The TiN (titanium nitride) film 45 (the thickness about 50 nm) is deposited through the underlying film 55 on the inter-layer insulating film 30 of SiO2 by the sputtering. The W (tungsten) plug layer 50 is embedded in the via hole 21 by the CVD, and the W plug layer 50 is flattened by the CMP as shown in the left diagram of FIG. 4 B. Accordingly, the underlying film 55 is penetrated by the via hole 21.

As for the 1st layer, as shown in the right diagram of FIG. 4 A, the inter-layer insulating film 30 of SiO2 is deposited on the Si (silicon) substrate 10 in which the pixels etc. are created by the CVD. By the sputtering, the underlying film 55 (the thickness about 150 nm) is deposited directly on the inter-layer insulating film 30 of SiO2. And the contact hole (window) 11 which penetrates both the inter-layer insulating film 30 of SiO2 and the underlying film 55 is formed.

After the Ti (titanium) film 40 (the thickness about 20 nm) is deposited through the underlying film 55 on the inter-layer insulating film 30 of SiO2 by the sputtering, the TiN (titanium nitride) film 45 (the thickness about 50 nm) is deposited. The W (tungsten) plug layer 50 is embedded in the contact hole 11 by the CVD, and the W plug layer 50 is flattened by the CMP as in the right diagram of FIG. 4 B. Accordingly, the underlying film 55 is penetrated by the contact hole 11.

As for both the 1st layer and the 2nd or subsequent layer, the underlying film 55 which is the film which serves as the underlay of the aluminum wiring layer 70 is made of the TiN (titanium nitride) film or the SiN (silicon nitride) film which does not penetrate H2 (hydrogen).

The underlying film 55 of about 150 nm thickness is deposited. Additionally, the Ti film 40 of about 20 nm thickness and the TiN film 45 of about 50 nm thickness are also deposited. With respect to the portion 56 of the underlying film 55 deposited on the inter-layer insulating film 30 of SiO2, the W plug layer 50 can be flattened by the CMP, while the underlying film 55 of about 50 nm thickness remain. The amount of thickness reduction is based on the excessive polishing.

Incidentally, it is necessary to deposit the W plug layer 50 of about 400 nm thickness for the 0.3 to 0.4 micrometer via hole 21 or the contact hole 11, and the underlying film 55 of about 100 nm thickness is removed by the excessive polishing of about 30%.

Therefore, the W plug layer 50 can be flattened by depositing the underlying film 55 of about 150 nm and making the underlying film 55 of about 50 nm remain by the CMP for the portion 56 of the underlying film 55 deposited on the inter-layer insulating film 30 of SiO2.

Next, as for both the first layer and the 2nd or subsequent layer, as shown in FIG. 4 C, the Ti (titanium) film 60, the TiN (titanium nitride) film 65, the Al (aluminium) wiring layer 70, the Ti film 80, and the TiN film 85 (the thickness is in this order about 20 nm, about 50 nm, 0.3-1.0 micrometers, about 5 nm, and about 100 nm) are deposited from the bottom in this order by the sputtering, so that they extend to the W plug layer 50 from the inter-layer insulating film 30 of SiO2.

Through the photo etching, the patterning of the wiring is carried out, and by the CVD, the inter-layer insulating film 90 of SiO2 is deposited on the inter-layer insulating film 30 of SiO2 so as to cover the wiring.

As a material of the aluminum wiring layer 70, Al (aluminium) in which a small amount of Cu (copper) is contained is used in this embodiment.

As for both the first layer and the second or subsequent layer, as shown in FIG. 4 B, the portion 56 of the underlying film 55 deposited on the inter-layer insulating film 30 of SiO2 remains, and it means that the underlying film 55 is formed between the inter-layer insulating film 30 of SiO2 and the Ti film 60 as shown in FIG. 4 C.

Thus, the underlying film 55 is formed between the inter-layer insulating film 30 of SiO2 and the Ti film 60, and the undersurface of the Ti film 60 is covered by the underlying film 55. Instead of the Ti film 60, the undersurface of the underlying film 55 which is the TiN film or the SiN film is exposed to the inter-layer insulating film 30 of SiO2 and the undersurface of the Ti film 60 is not exposed to the inter-layer insulating film 30 of SiO2. The adverse affecting of the Ti film 60 on the H2 annealing as in the conventional method can be suppressed.

Furthermore, in order to flatten the W plug layer 50 the CMP is performed and the dry etch back is not performed, and the recess 51 of the W plug layer 50 can be avoided.

Figure 5:
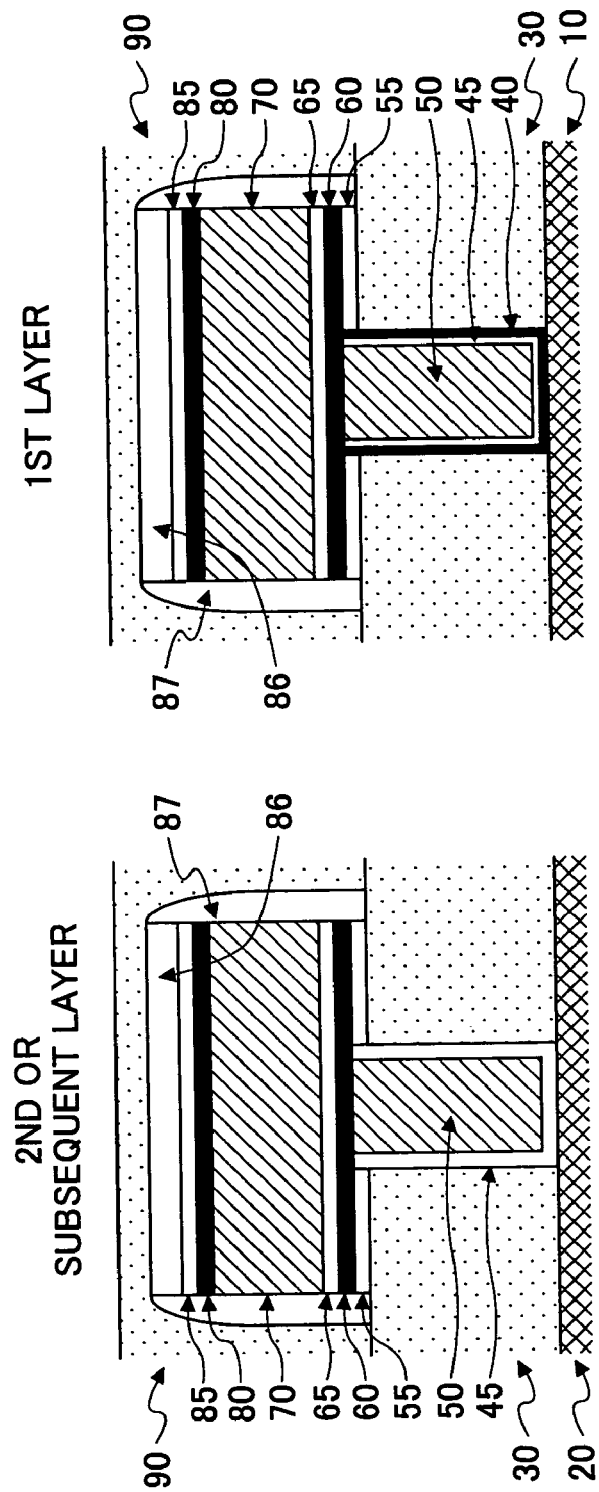
FIG. 5 is a diagram for explaining the sidewall.

FIG. 5 shows the side wall for both the first layer and the second or subsequent layer. As shown in FIG. 5, the upper-lying film 86 (the thickness is 30-50 nm) is further deposited on the W plug layer 50 by the sputtering. The TiN (titanium nitride) sidewall 87 is formed on the side surface of the aluminum wiring layer 70 by the CVD and the RIE (reactive ion etching). After this, the inter-layer insulating film 90 of SiO2 is deposited.

The upper-lying film 86 covering the top surface of the aluminum wiring layer 70 is made of the SiN (silicon nitride) film or the SiON (silicon-nitride oxide) film, and serves to prevent the removing of the TiN film 85 by the RIE.

The undersurface of the Ti film 60 is covered by the underlying film 55, and the side surface of the Ti film 60 is covered by the TiN sidewall 87. The undersurface of the Ti film 60 is not exposed to the inter-layer insulating film 30 of SiO2, and the side surface of the Ti film 60 is not exposed to the inter-layer insulating film 90 of SiO2. Thus, the adverse affecting of the Ti film 60 on the H2 annealing can be suppressed further.

Furthermore, the side surface of the Ti film 80 is covered by the TiN sidewall 87, and the adverse affecting of the Ti film 80 on the H2 annealing can be suppressed. Furthermore, the side surface of the aluminum wiring layer 70 is covered by the TiN sidewall 87, and the reflected-light noise (see the arrow of FIG. 9) inconvenient for CMOS image sensors can be suppressed.

Figure 6:
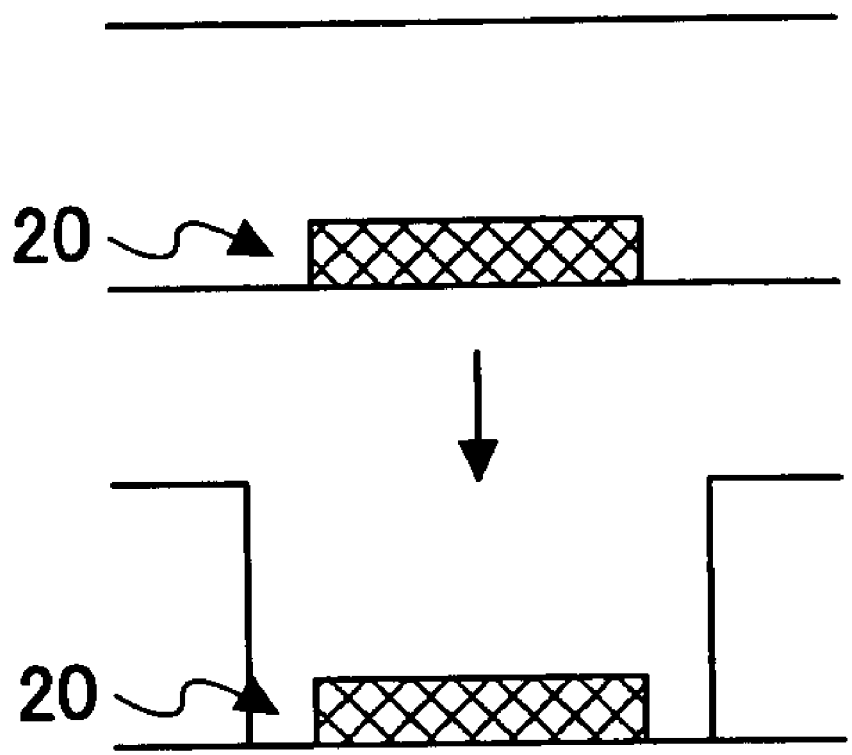
FIG. 6 is a diagram for explaining the alignment mark.

Moreover, as for the second or subsequent layer, as shown in FIG. 6, before depositing the underlying film 55, the resist pattern in which only the alignment mark of the lower layer wiring structure 20 and the via hole 21 by the scribing is open is formed. And by the etching, the lower layer wiring structure 20 of the alignment mark by the scribing may be exposed. This makes it easier to carry out the positioning of the lower layer wiring structure 20 and the via hole 21 in the photo-lithographic process.

Next, the CMOS image sensor in the 1st embodiment will be explained based on the top view and the side view. FIG. 7A through FIG. 7D are the diagrams showing the CMOS image sensor in the 1st embodiment of the invention. Specifically, FIG. 7A is the top view of the Si substrate 10, FIG. 7B is the top view of the 1st layer (a lowermost wiring layer) of the wiring structure, FIG. 7C is the top view of the 2nd layer of the wiring structure, and FIG. 7 D is the top view of the 3rd layer (an uppermost wiring layer) of the wiring structure.

The aluminum wiring layer 70 and the inter-layer insulating film 90 of SiO2 are illustrated in FIG. 7B, FIG. 7C, and FIG. 7D, respectively. In addition, in order to distinguish these layers mutually, the subscript A is attached to the aluminum wiring layer 70 and the inter-layer insulating film 90 of SiO2 concerning the 1st layer, the subscript B is attached to the aluminum wiring layer 70 and the inter-layer insulating film 90 of SiO2 concerning the 2nd layer, and the subscript C is attached to the aluminum wiring layer 70 and the inter-layer insulating film 90 of SiO2 concerning the 3rd layer.

Figure 1A:
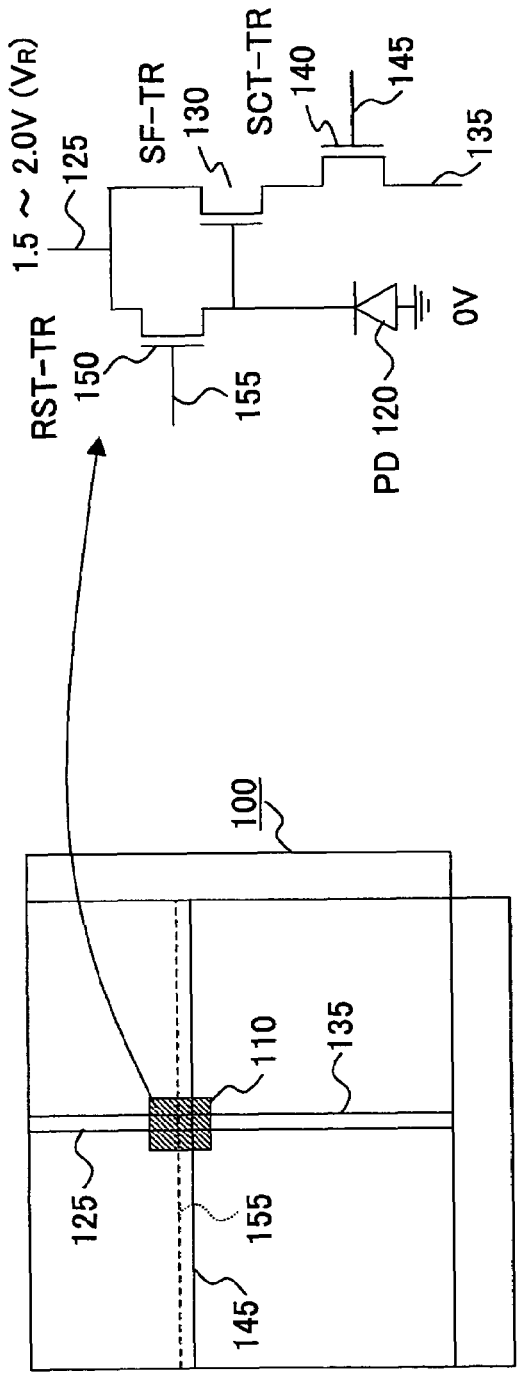
FIG. 1A and FIG. 1B are plan views and circuit configuration diagrams showing the unit pixels of the CMOS image sensors.
Figure 1B:
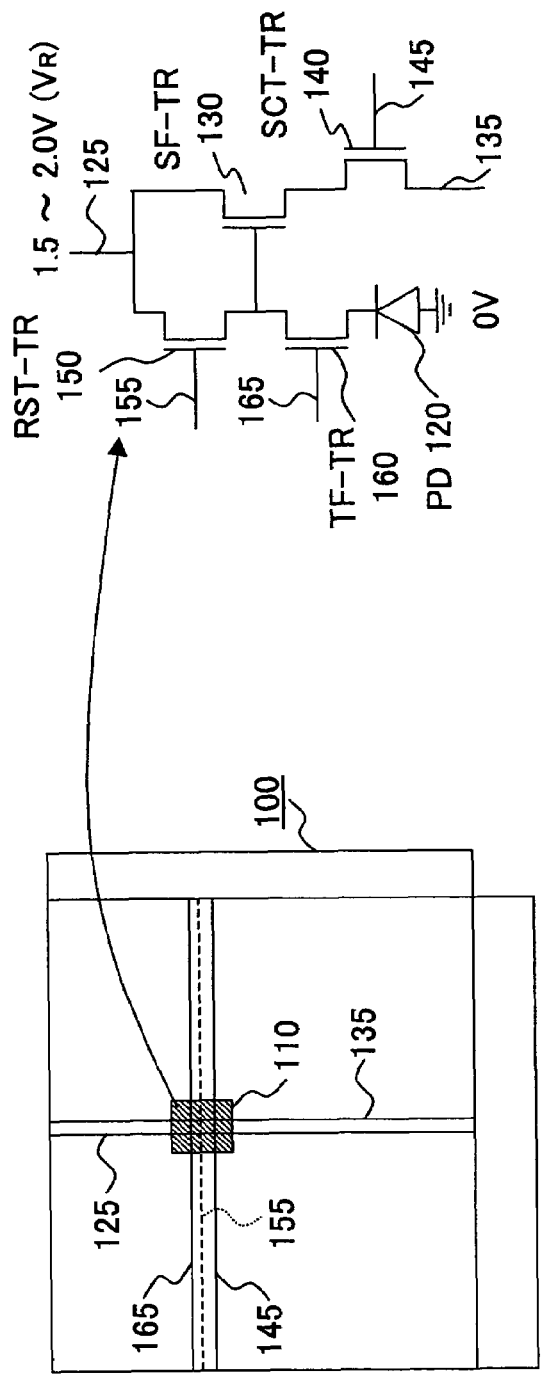
Figure 2:
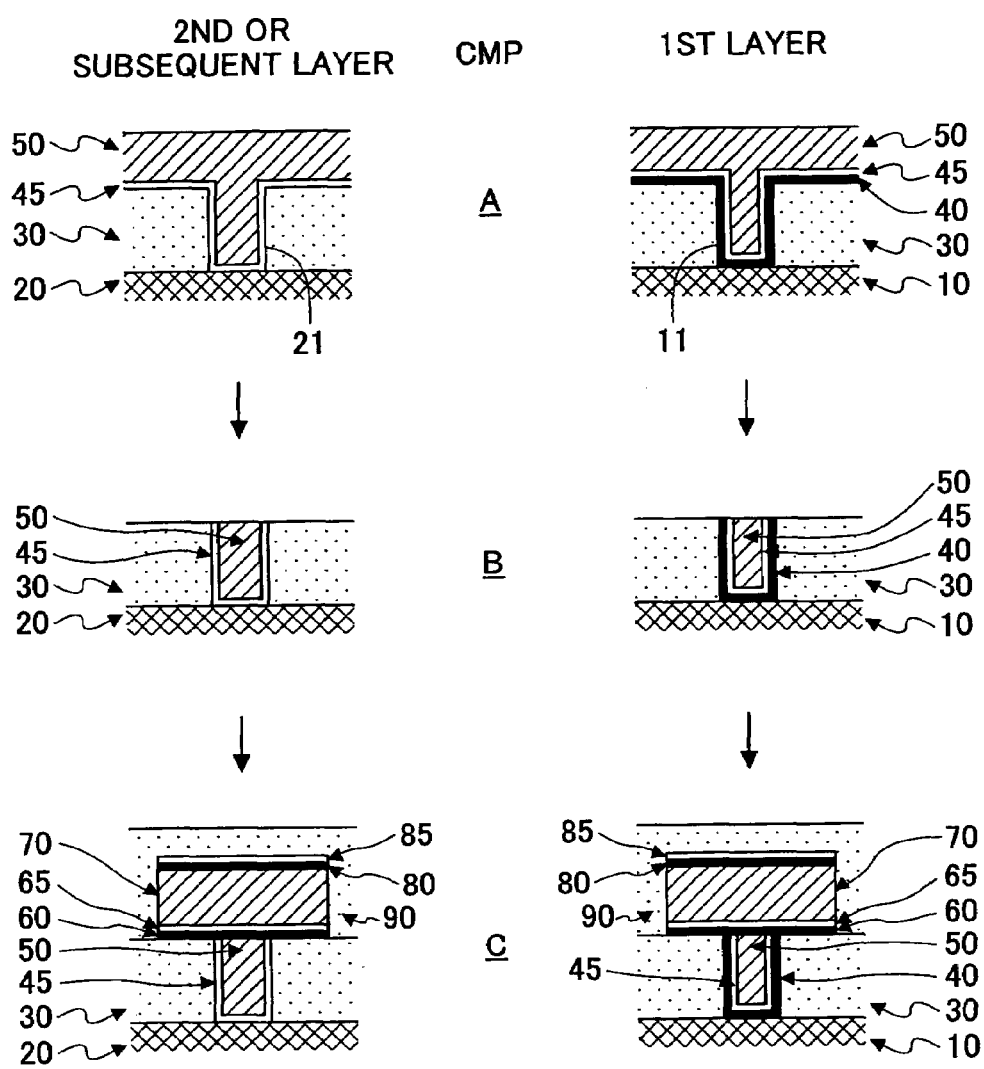
FIG. 2 is a cross-sectional view showing the principal part of the conventional CMOS image sensor and for explaining the manufacture method using the CMP.
Figure 3:
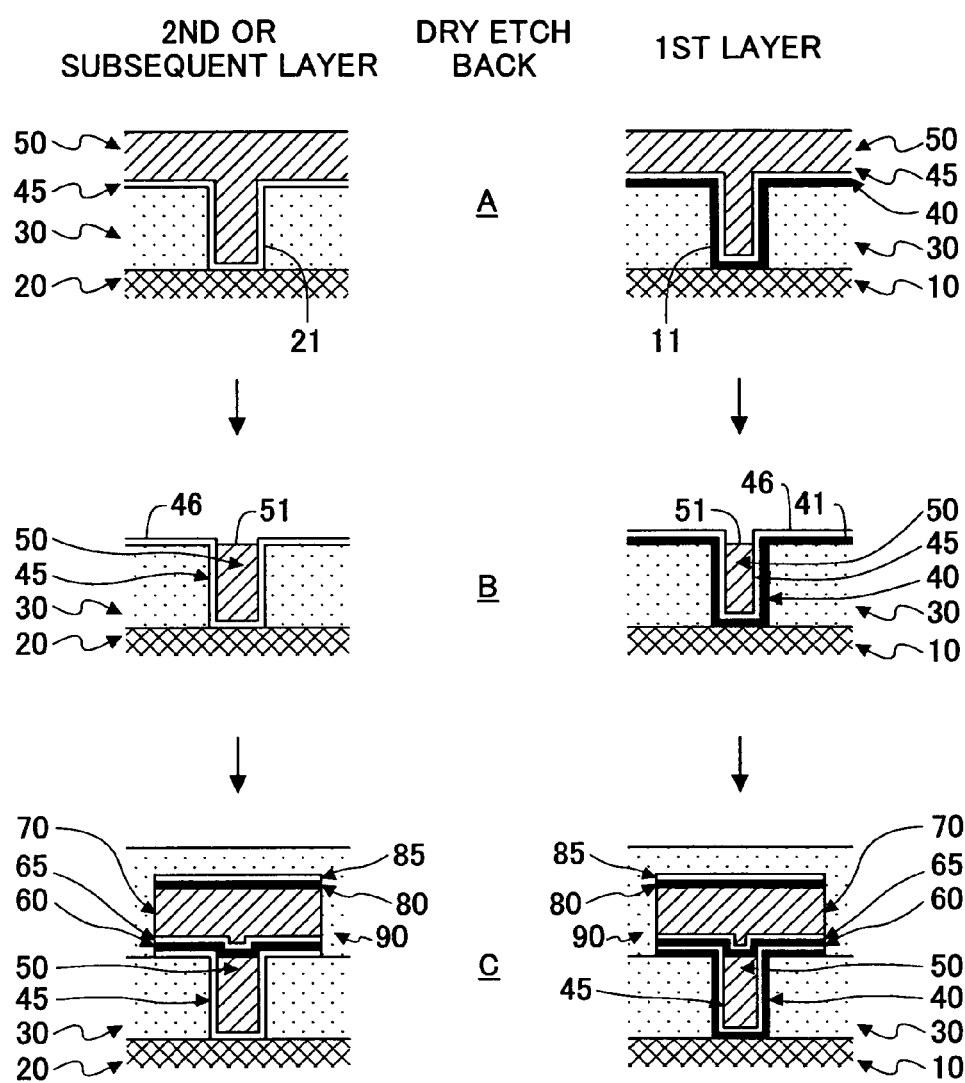
FIG. 3 is a cross-sectional view showing the principal part of the conventional CMOS image sensor and for explaining the manufacture method using the dry etch back.

In FIG. 7A, the PD 120, the SF-TR 130, the SCT-TR 140, the RST-TR 150, and the TF-TR 160 which are the same as illustrated in FIG. 1 are illustrated. In FIG. 7A, the selection line 145 and the transfer line 165 which are the same as the corresponding elements in FIG. 1 are illustrated. In FIG. 7B, the reset line 155 (a part of the aluminum wiring layer 70A) which is the same as the corresponding element in FIG. 1 is illustrated. In FIG. 7C, the reset voltage line 125 and the signal-voltage read-out line 135 (a part of the aluminum wiring layer 70B) which are the same as the corresponding elements in FIG. 1 are illustrated.

As understood from the foregoing, the CMOS image sensors are of the 4 transistor type. Further illustrated in FIG. 7A are the W plug layer $50_{FD}$ which is the floating diffusion (FD), the W plug layer $50_{125}$ for the reset voltage line 125, and the W plug layer $50_{135}$ for the signal-voltage read-out line 135.

Figure 9:
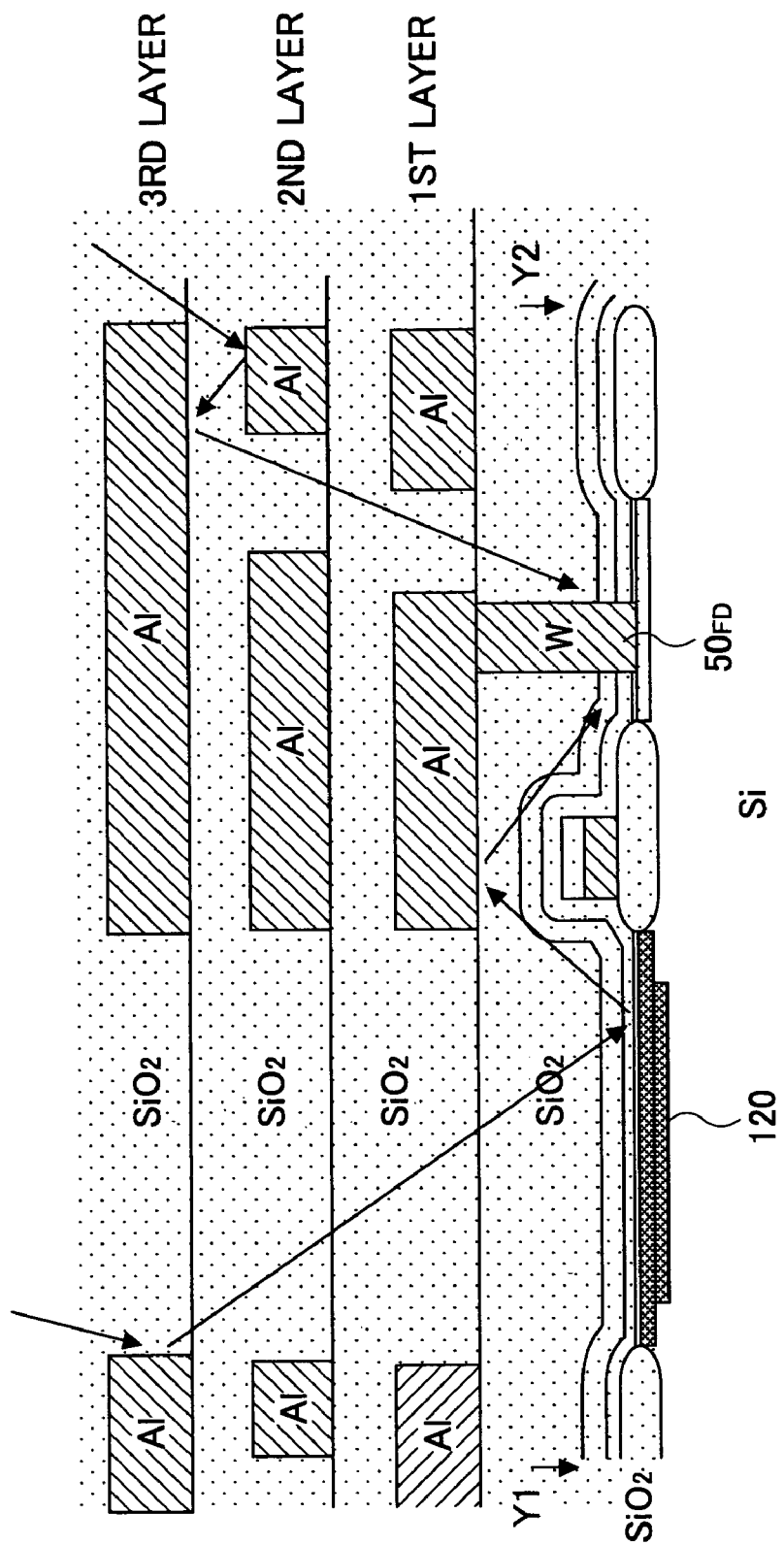
FIG. 9 is a side view of the CMOS image sensor in the 1st embodiment of the invention.

FIG. 8 and FIG. 9 are the side views of the CMOS image sensor in the 1st embodiment of the invention. Specifically, FIG. 8 is a cross-sectional view of the CMOS image sensor taken along the line X1-X2 in FIG. 7A, and FIG. 9 is a cross-sectional view of the CMOS image sensor taken along the line Y1-Y2 in FIG. 7A.

It is supposed that each wiring structure of the 1st layer, the 2nd layer, and the 3rd layer is the wiring structure of the 1st embodiment which has been described above with FIG. 4.

By the way, the wiring structure of the uppermost wiring layer (the 3rd layer) is considered. In many cases, the area of the aluminum wiring layer 70 of the uppermost wiring layer is larger than the area of the aluminum wiring layer 70 of other layers. Actually, such is illustrated as in FIG. 7A to FIG. 9.

For this reason, the area of the undersurface of the Ti film 60 of the uppermost wiring layer in many cases is larger than the area of the undersurface of the Ti film 60 of other layers.

Therefore, the Ti film 60 of the uppermost wiring layer in many cases has the adverse affecting on the H2 annealing more considerably when compared with the Ti film 60 of other layers. For this reason, it can be said that the use of the wiring structure of the 1st embodiment described with FIG. 4 is advantageous especially for the uppermost wiring layer.

Furthermore, if the problem of the reflected-light noise inconvenient for the CMOS image sensors is considered, it can be said that, in order to use the aluminum wiring layer 70 as the light shading layer, the use of the wiring structure of the 1st embodiment explained with FIG. 4 is still advantageous for the uppermost wiring layer (the 3rd layer) in which the area of aluminum wiring layer 70 in many cases is large, and for the lowermost wiring layer (the 1st layer) close to the W plug layer $50_{FD}$ which is the floating diffusion.

Especially for the lowermost wiring layer (the 1st layer), the advantage mentioned above becomes considerable when performing the operation to retain for a fixed time (more than several ms) the signal charge in the floating diffusion.

In addition, the situation of the reflected light is indicated by the arrows in FIG. 8 and FIG. 9.

The 2nd Embodiment

Figure 10:
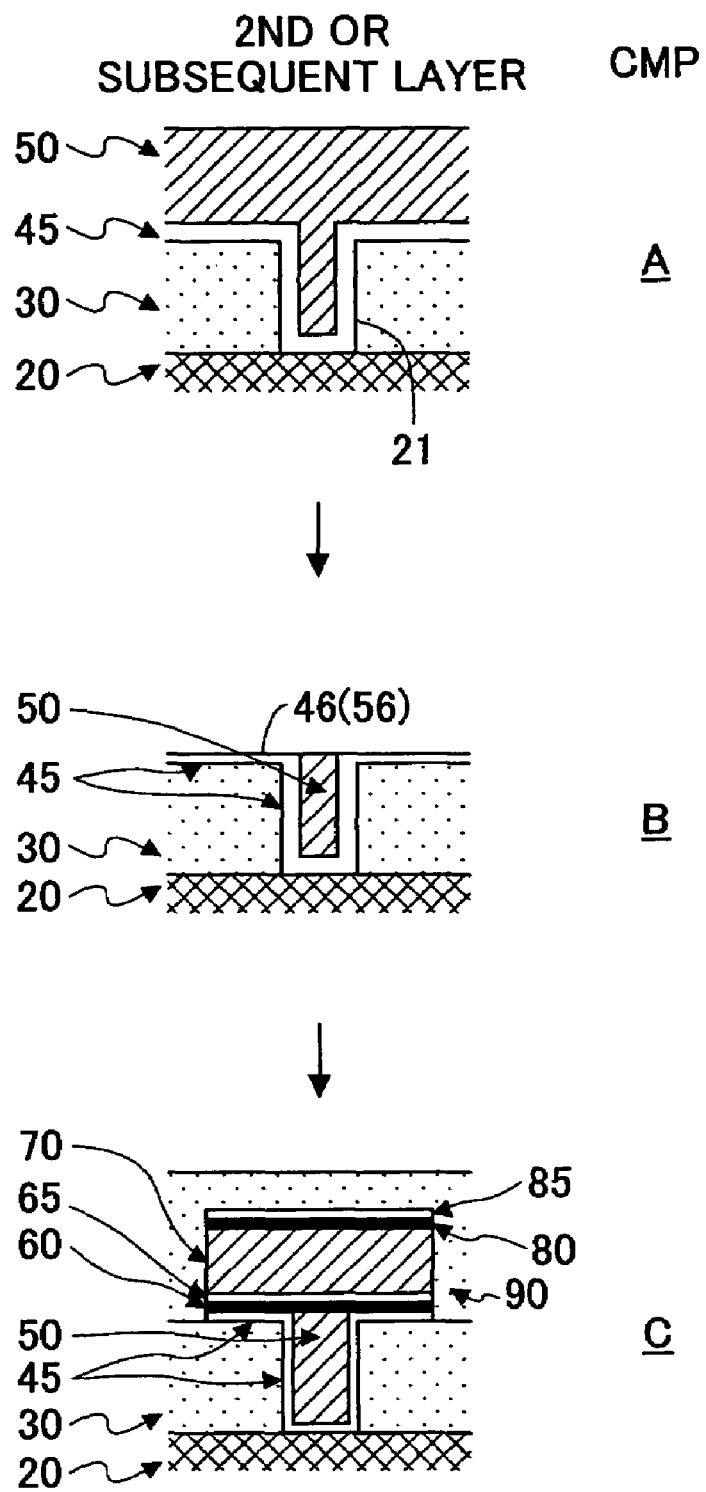
FIG. 10 is a cross-sectional view showing the principal part of the CMOS image sensor in the 2nd embodiment of the invention and for explaining the manufacture method.

FIG. 10 shows the principal part of the 2nd embodiment of the CMOS image sensor for explaining the manufacture method. Specifically, FIG. 10 shows an embodiment of the method of forming the multi-layer wiring structure using the CMP (chemical mechanical polishing).

FIG. 10 shows the wiring structure of the 2nd or subsequent layer from the bottom, and the flow of the diagrams A, B and C in FIG. 10 is equivalent to the flow of the process of forming the wiring structure.

The 2nd embodiment is a modification of the 1st embodiment. The composition of the 2nd embodiment that is the same as in the 1st embodiment is as described above in the 1st embodiment, and the composition of the 2nd embodiment that is different from that of the 1st embodiment will be described.

The inter-layer insulating film 30 of SiO2 is deposited, the via hole 21 is formed, the TiN film 45 is deposited, and the W plug layer 50 is embedded. Flattening the W plug layer 50 as shown in FIG. 4 B left is not performed in this embodiment.

As shown in FIG. 10 A, the inter-layer insulating film 30 of SiO2 is deposited on the lower layer wiring structure 20 by the CVD, and the via hole (window) 21 which penetrates the inter-layer insulating film 30 of SiO2 is formed.

The TiN (titanium nitride) film 45 (the thickness about 200 nm) which serves as the underlying film on the inter-layer insulating film 30 of SiO2 by sputtering deposited.

The W (tungsten) plug layer 50 is embedded through the TiN film 45 which serves as the underlying film in the via hole 21 by the CVD, and the W plug layer 50 is flattened by the CMP as shown in FIG. 10 B. It means that the TiN film 45 which serves as the underlying film is formed between the via hole 21 and the W plug layer 50.

The W plug layer 50 can be flattened, making the TiN film 45 (underlying film) about 50 nm remain by the CMP about the 2nd or subsequent layer about the portion 46 deposited on the inter-layer insulating film 30 of SiO2 of the TiN film 45 (the underlying film) by depositing the TiN film 45 (the underlying film) about 200 nm. This is the same as that of the 1st embodiment.

The 3rd Embodiment

Figure 11:
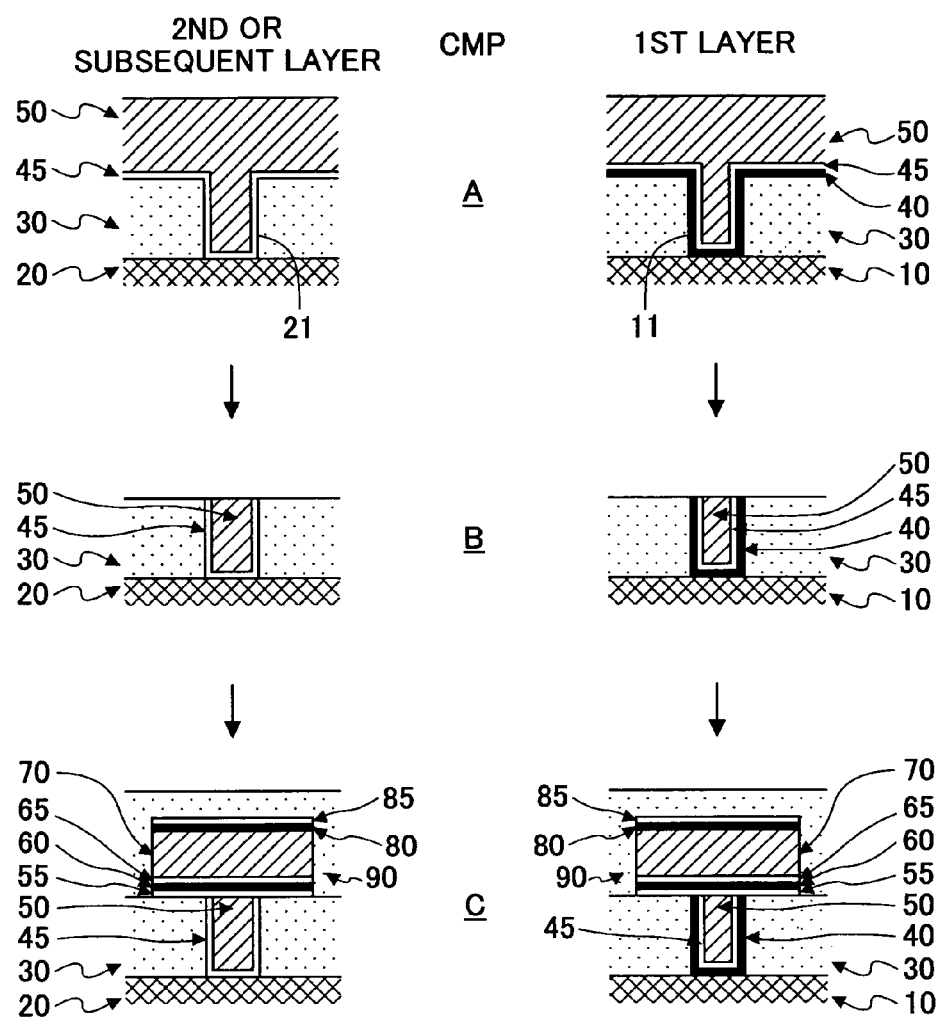
FIG. 11 is a cross-sectional view showing the principal part of the CMOS image sensor in the 3rd embodiment of the invention and for explaining the manufacture method.

FIG. 11 shows the principal part of the 3rd embodiment of the CMOS image sensor for explaining the manufacture method. Specifically, FIG. 11 shows an embodiment of the method of forming the multi-layer wiring structure using the CMP (chemical mechanical polishing).

FIG. 11 left diagram shows the wiring structure of the second or subsequent layer from the bottom, FIG. 10 right diagram shows the wiring structure of the 1st layer from the bottom, and the flow of the diagrams A, B and C of FIG. 11 is equivalent to the flow of the process of forming the wiring structure.

The 3rd embodiment is a modification of the 1st embodiment. The composition of the 3rd embodiment that is the same as that of the 1st embodiment is described above in the 1st embodiment, and the composition of the 3rd embodiment that is different from that of the 1st embodiment will be described.

The inter-layer insulating film 30 of SiO2 is deposited, the via hole 21 is formed, the TiN film 45 is deposited, and the W plug layer 50 is embedded.

Instead of flattening the W plug layer 50 as in the left diagram of FIG. 4 B, as in the left diagram of FIG. 11 A, the inter-layer insulating film 30 of SiO2 is deposited on the lower layer wiring structure 20 by the CVD, and the via hole (window) 21 which penetrates the inter-layer insulating film 30 of SiO2 is formed.

The TiN (titanium nitride) film 45 (the thickness is about 50 nm) is deposited on the inter-layer insulating film 30 of SiO2 by sputtering, and the W (tungsten) plug layer 50 is embedded in the via hole 21 by the CVD. As shown in the left diagram of FIG. 11 B, the W plug layer 50 is flattened by the CMP.

As for the first layer, as in the right diagram of FIG. 4 A, the inter-layer insulating film 30 of SiO2 is deposited, the underlying film 55 is deposited and the contact hole 11 is formed.

After the Ti film 40 is deposited, the TiN film 45 is deposited, and the W plug layer 50 is embedded.

Flattening the W plug layer 50 as shown in FIG. 4 B right is not performed. As shown in FIG. 11A right, the inter-layer insulating film 30 of SiO2 is deposited on the Si substrate 10 in which the pixels etc. are created by the CVD, and the contact hole (window) 11 which penetrates the inter-layer insulating film 30 of SiO2 is formed.

After depositing the Ti (titanium) film 40 (the thickness about 20 nm) on the inter-layer insulating film 30 of SiO2 by the sputtering, the TiN (titanium nitride) film 45 (the thickness about 50 nm) is deposited.

The W (tungsten) plug layer 50 is embedded by the CVD in the contact hole 11, and the W plug layer 50 is flattened by the CMP as shown in FIG. 11B right.

It is also related with the 1st layer also about the 2nd or subsequent layer, and is sputtering as in the diagrams of FIG. 11 C succeedingly.

The underlying film 55 (the thickness about 50 nm) is deposited so that it may extend on the W plug layer 50 from on the inter-layer insulating film 30 of SiO2, and it is made below to be the same as that of FIG. 4 C, so that it may extend to the W plug layer 50 from the inter-layer insulating film 30 of SiO2.

From the top, the TiN (titanium nitride) film 85, the Ti (titanium) film 80, the Al (aluminium) wiring layer 70, the TiN (titanium nitride) film 65, and the Ti (titanium) film 60 are deposited on the underlying film 55, and the inter-layer insulating film 90 of SiO2 is deposited. It means that the underlying film 55 is formed between the W plug layer 50 and the Ti film 60.

The underlying film 55 which is the film which serves as the underlay of the aluminum wiring layer 70 concerning the 1st layer or the 2nd or subsequent layer is the TiN (titanium nitride) film. This film is not penetrated by H2 (hydrogen). It means that the underlying film 55 is formed between the inter-layer insulating film 30 of SiO2 and the Ti film 60 as in the diagrams of FIG. 11 C concerning the 1st layer or the 2nd or subsequent layer. This is the same as that of the 1st embodiment.

The 4th Embodiment

Figure 12:
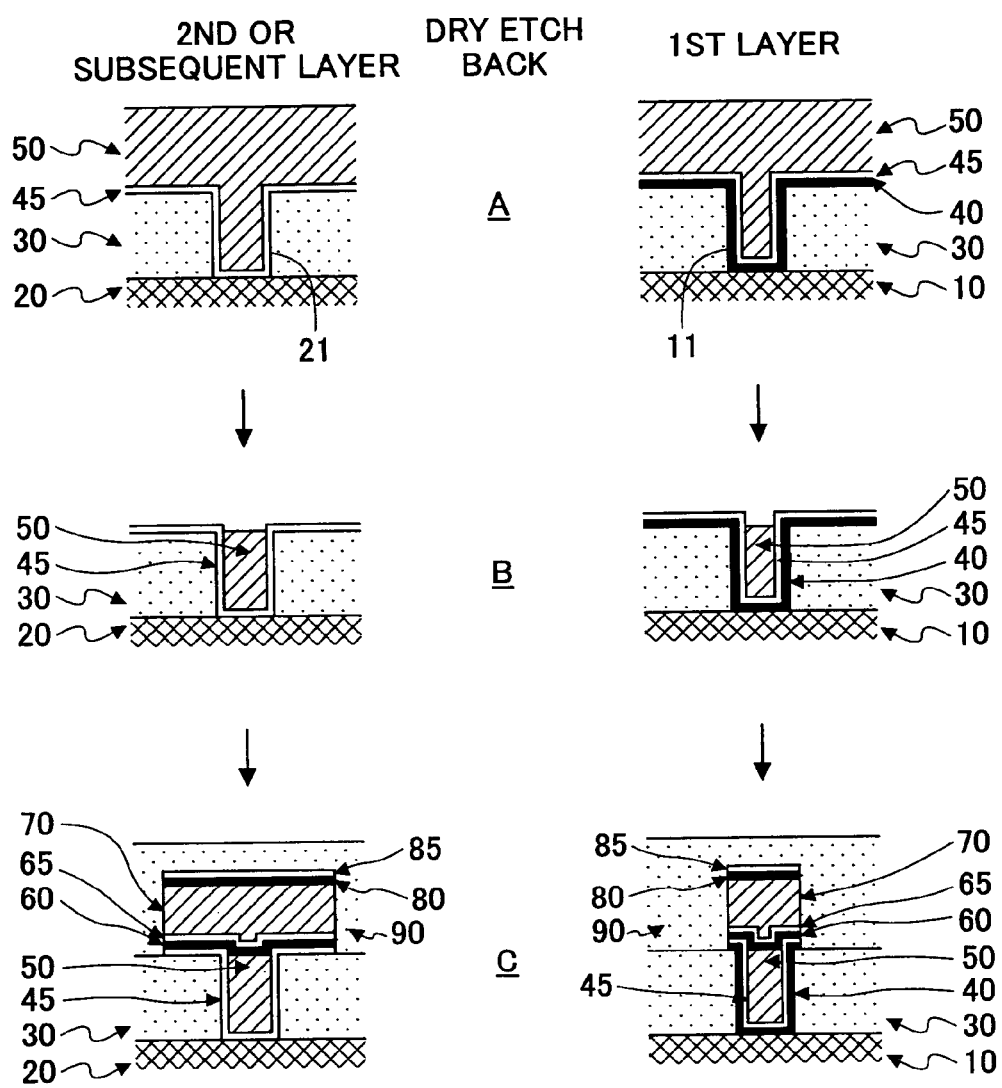
FIG. 12 is a cross-sectional view showing the principal part of the CMOS image sensor in the 4th embodiment of the invention and for explaining the manufacture method.

FIG. 12 shows the principal part of the 4th embodiment of the CMOS image sensor for explaining the manufacture method. Specifically, FIG. 12 shows an embodiment of the method of forming the multi-layer wiring structure using the dry etch back.

FIG. 12 left diagram shows the wiring structure of the 2nd or subsequent layer from the bottom, FIG. 12 right diagram shows the wiring structure of the 1st layer from the bottom, and the flow of the diagrams A, B and C of FIG. 12 is equivalent to the flow of the process of forming the wiring structure.

As for the 2nd or subsequent layer, as in the left diagram of FIG. 12 A, the inter-layer insulating film 30 of SiO2 is deposited on the lower layer wiring structure 20 by the CVD, and the via hole (window) 21 which penetrates the inter-layer insulating film 30 of SiO2 is formed.

The TiN (titanium nitride) film 45 (the thickness about 50 nm) is deposited on the inter-layer insulating film 30 of SiO2 by sputtering, the W (tungsten) plug layer 50 is embedded by the CVD in the via hole 21, and the W plug layer 50 is flattened by the dry etch back like FIG. 12B left.

The inter-layer insulating film 30 of SiO2 is deposited like FIG. 12A right about the 1st layer on the Si substrate 10 in which the pixels etc. are created by the CVD, and the contact hole (window) 11 which penetrates the inter-layer insulating film 30 of SiO2 is formed.

After the Ti (titanium) film 40 (the thickness about 20 nm) is deposited on the inter-layer insulating film 30 of SiO2 by sputtering, the TiN (titanium nitride) film 45 (the thickness about 50 nm) is deposited, the W (tungsten) plug layer 50 is embedded by the CVD in the contact hole 11, and the W plug layer 50 is flattened by the dry etch back like FIG. 12B right.

As for both the first layer and the 2nd or subsequent layer, as in the diagram of FIG. 12 C, the Ti (titanium) film 60, the TiN (titanium nitride) film 65, the Al (aluminium) wiring layer 70, the Ti film 80, and the TiN film 85 (the thickness is in this order about 20 nm, about 50 nm, 0.3-1.0 micrometers, about 5 nm, and about 100 nm) are deposited from the bottom in this order by the sputtering, so that they extend to the W plug layer 50 from the inter-layer insulating film 30 of SiO2.

Through the photo etching, the patterning of the wiring is carried out, and by the CVD, the inter-layer insulating film 90 of SiO2 is deposited on the inter-layer insulating film 30 of SiO2 so as to cover the wiring.

As a material of the aluminum wiring layer 70, Al (aluminium) in which a small amount of Cu (copper) is contained is used in this embodiment.

As for the 1st layer, the undersurface of the Ti film 40 is exposed to the inter-layer insulating film 30 of SiO2, as shown in FIG. 12 B right.

However, it is possible to avoid approximately exposure of the undersurface of the Ti film 40 at the inter-layer insulating film 30 of SiO2, as shown in FIG. 12 C right, by depositing the aluminum wiring layer 70 only on the W plug layer 50 of the inter-layer insulating film 30 of SiO2 and the W plug layers 50. Therefore, the adverse affecting of the Ti film 40 on the H2 annealing can be suppressed.

Next, the CMOS image sensor in the 4th embodiment of the invention will be explained.

Figure 13A:
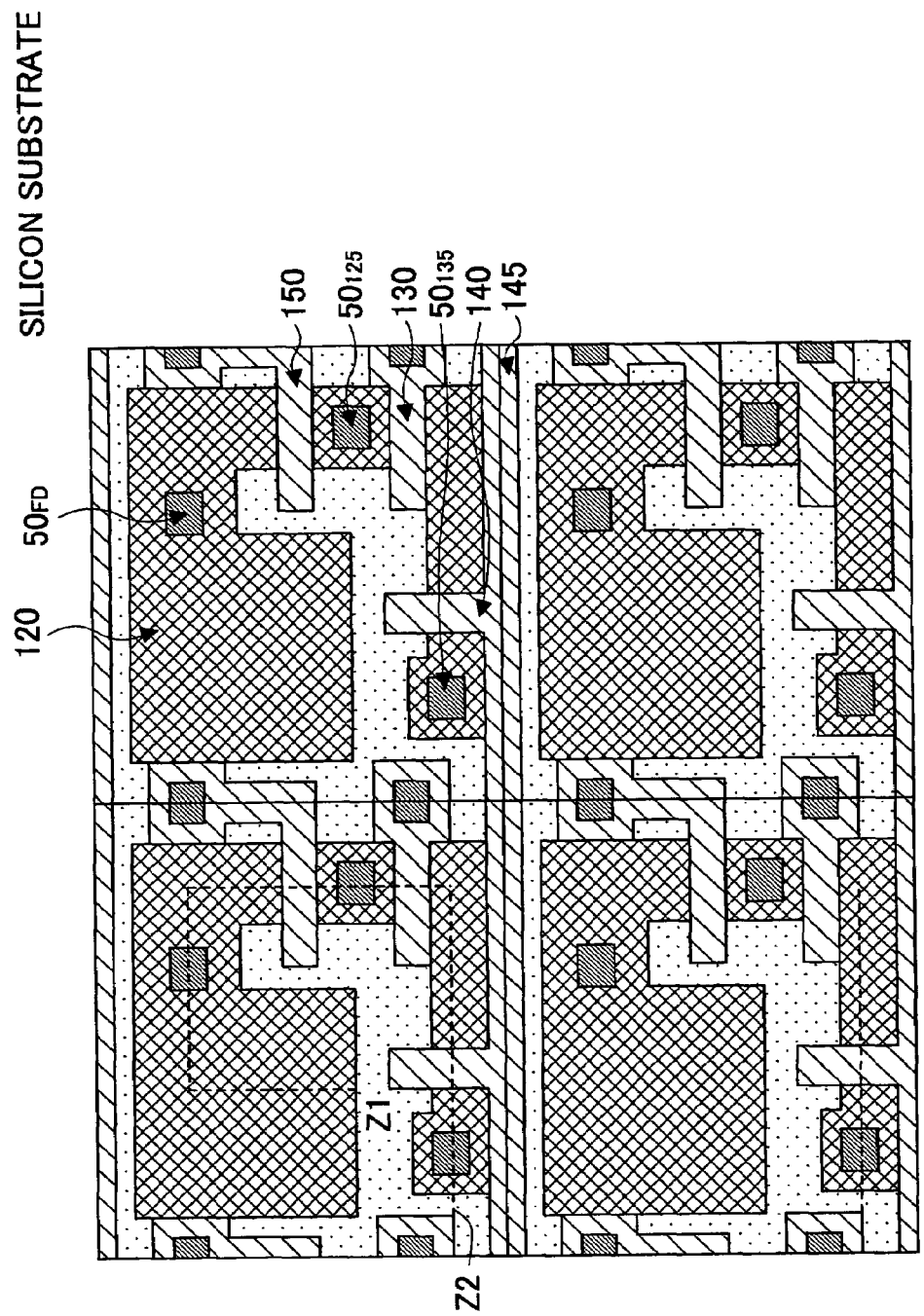
FIG. 13A, FIG. 13B and FIG. 13C are top views of the CMOS image sensor in the 4th embodiment of the invention.
Figure 13B:
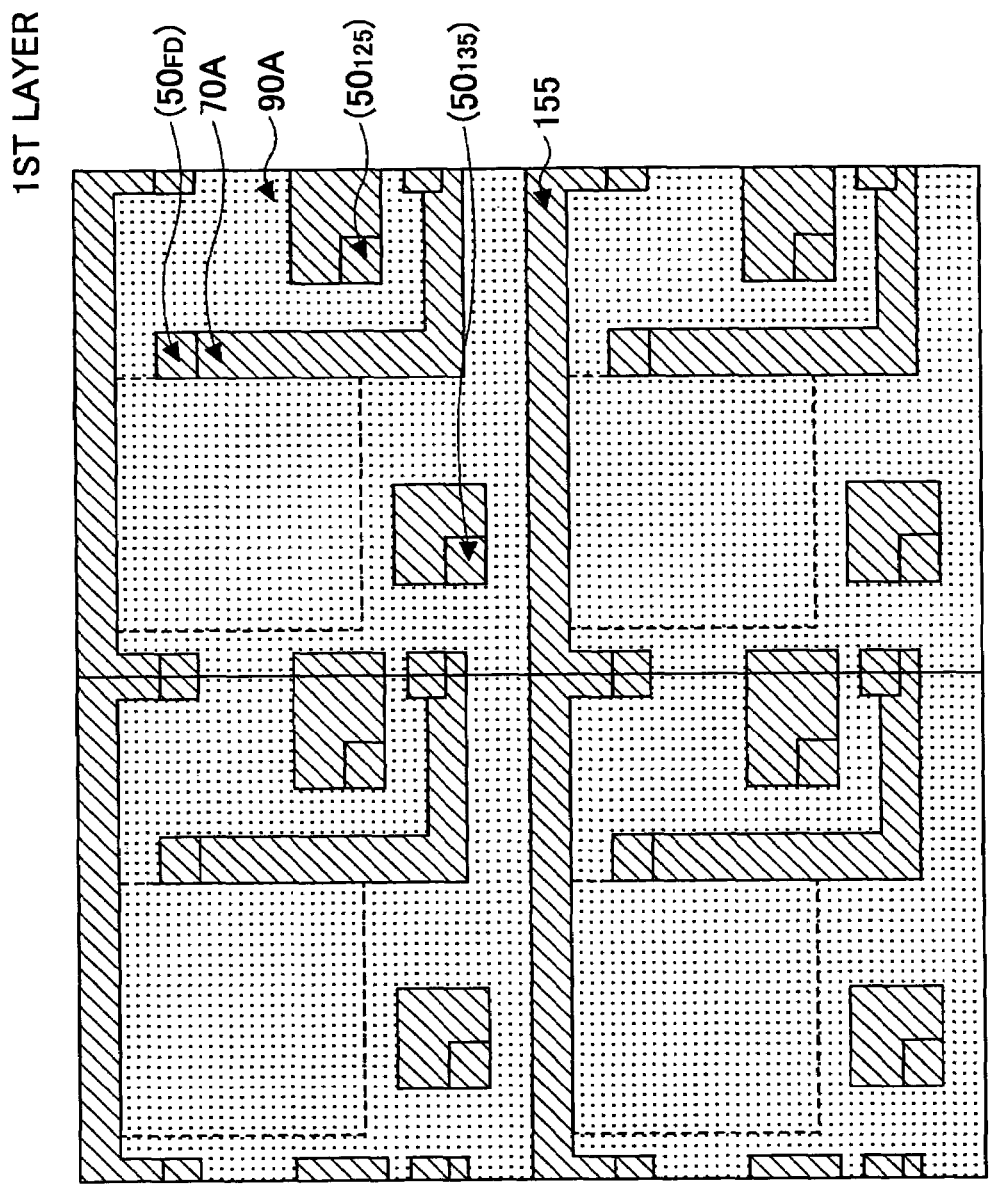
Figure 13C:
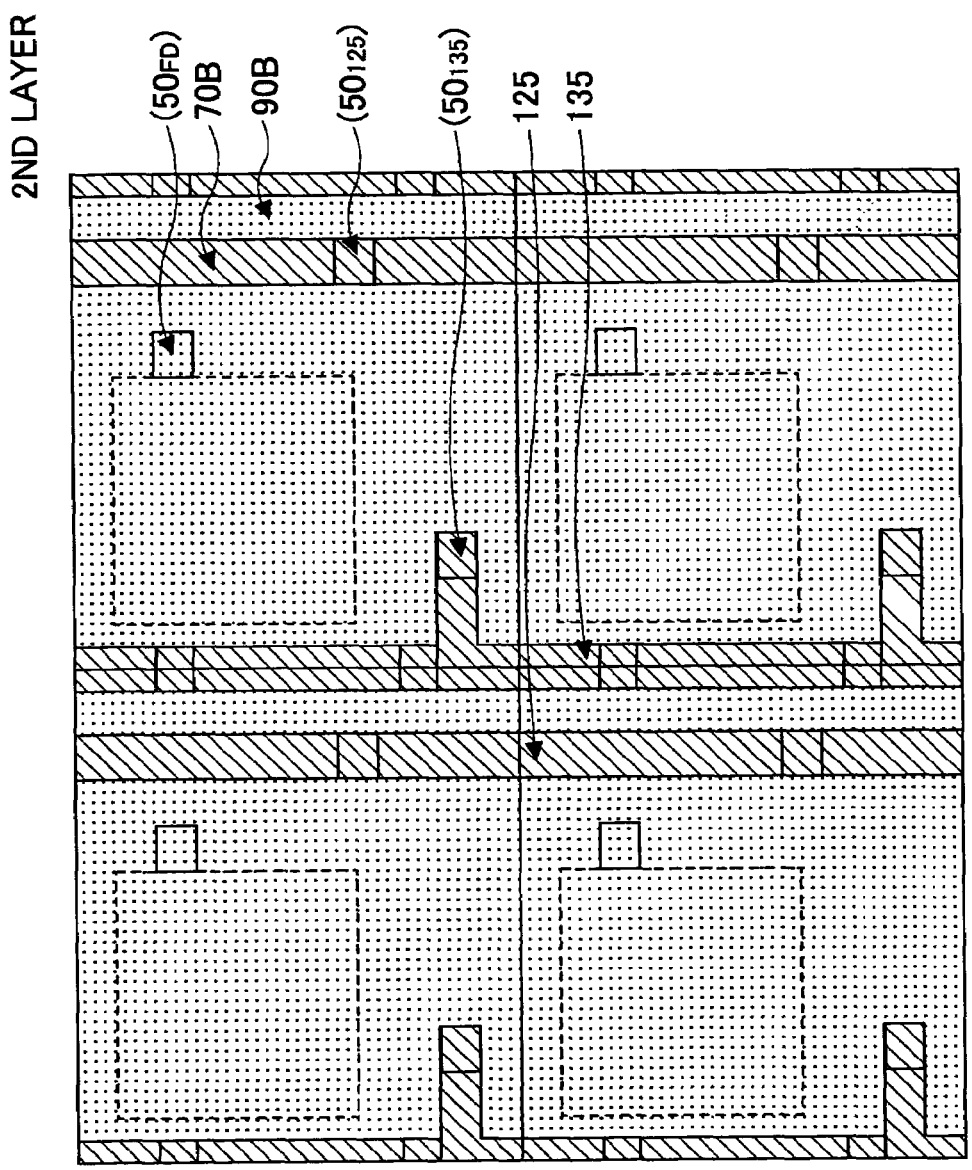

FIG. 13A, FIG. 13B and FIG. 13C are the top views of the CMOS image sensor of the 4th embodiment. Specifically, FIG. 13A is the top view of the Si substrate 10, the gate, the contact plug 50 and the 1st layer (a lowermost wiring layer). In FIG. 13A, the 1st layer is arranged approximately only on the contact plug 50. FIG. 13B is the top view of the wiring structure of the 2nd layer, and FIG. 13C is the top view of the wiring structure of the 3rd layer (an uppermost wiring layer).

However, the CMOS image sensor of FIG. 13A-13C is of the 3 transistor type while the CMOS image sensor of FIG. 7A-7D is of the 4 transistor type.

FIG. 14 is the side view of the CMOS image sensor in the 4th embodiment of the invention. FIG. 14 is equivalent to FIG. 8 or FIG. 9, and it is the cross-sectional view of the CMOS image sensor taken along the line Z1-Z2 in FIG. 13A.

Each wiring structure of the 1st layer, the 2nd layer, and the 3rd layer presupposes that it is the wiring structure which is explained as the 4th embodiment in FIG. 12.

By the way, wiring is not performed about the lowermost wiring layer (the 1st layer). Thereby, area of aluminum wiring layer of the lowermost wiring layer can be made small.

That is, it becomes possible actually like FIG. 12C right to make aluminum wiring layer 70 deposit only on the approximately W plug layer 50 of the inter-layer insulating film 30 of SiO2 and the W plug layer 50.

The 5th Embodiment

Figure 15:
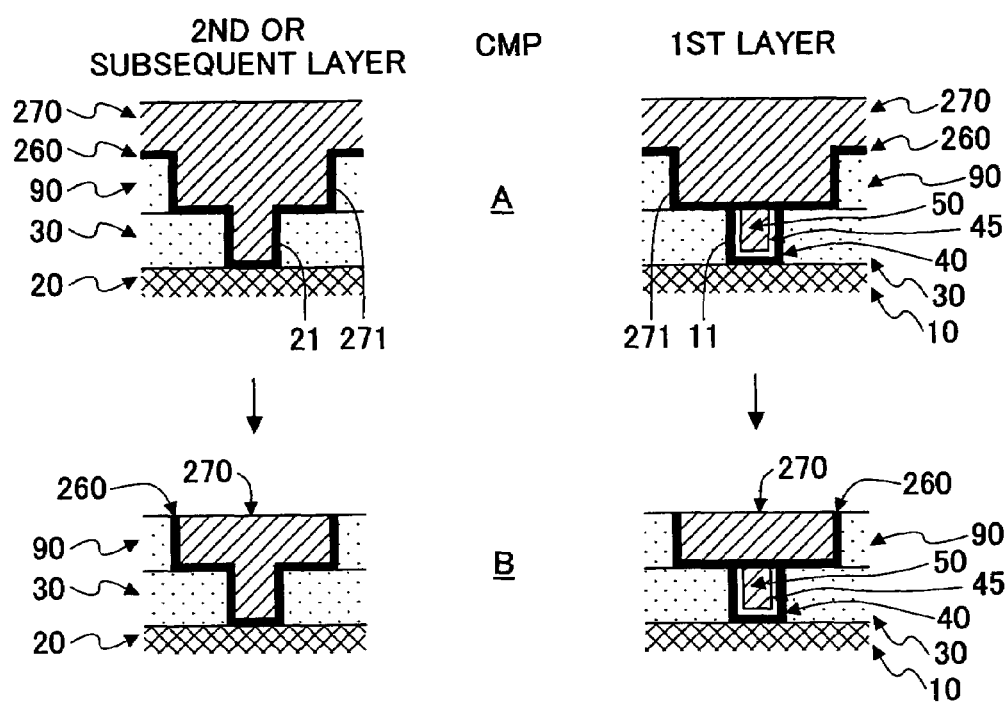
FIG. 15 is a cross-sectional view showing the principal part of the CMOS image sensor in the 5th embodiment of the invention and for explaining the manufacture method.

FIG. 15 is the principal part sectional view showing the 5th embodiment of CMOS image sensors and its manufacture method. FIG. 15 is an embodiment which forms the multi-layer wiring structure using the CMP (chemical mechanical polishing) in detail.

FIG. 15 left is the wiring structure after the bottom to the 2nd layer, FIG. 15 right is the wiring structure of the 1st layer from the bottom, and the flow of view 15A and B is equivalent to the flow (the damascene method) of the process which forms wiring structure.

The inter-layer insulating film 30 of SiO2 and the inter-layer insulating film 90 of SiO2 are deposited on the lower layer wiring structure 20 as in the left diagram of FIG. 15A concerning the 2nd or subsequent layer.

The wiring slot 271 which penetrates the inter-layer insulating film 90 of SiO2, and the via hole (window) 21 which penetrates the inter-layer insulating film 30 of SiO2 are formed.

The Ta (tantalum) film 260 is deposited on the inter-layer insulating film 30 of SiO2, and the inter-layer insulating film 90 of SiO2, Cu (copper) wiring layer 270 is embedded through the Ta film 260 in the wiring slot 271 and the via hole 21.

The Cu wiring layer 270 is flattened by the CMP.

In addition, it is possible to transpose the Ta film 260 to the TaN (tantalum nitride) film. The inter-layer insulating film 30 of SiO2 is deposited like FIG. 15A right about the 1st layer on the Si substrate 10 from which the pixel etc. is made, and the contact hole (window) 11 which penetrates the inter-layer insulating film 30 of SiO2 is formed.

After making the Ti (titanium) film 40 deposit on the inter-layer insulating film 30 of SiO2, make the TiN (titanium nitride) film 45 deposit, and the W (tungsten) plug layer 50 is embedded in the contact hole 11.

After the flattening of the W plug layer 50 by the CMP, the inter-layer insulating film 90 of SiO2 is deposited on the inter-layer insulating film 30 of SiO2, and the wiring slot 271 which penetrates the inter-layer insulating film 90 of SiO2 is formed.

The Ta film (tantalum) 260 is deposited on the inter-layer insulating film 30 of SiO2, and the inter-layer insulating film 90 of SiO2, Cu (copper) wiring layer 270 is embedded in the wiring slot 271, and Cu wiring layer 270 is flattened by the CMP like FIG. 15B right.

In addition, it is possible to transpose the Ta film 260 to the TaN (tantalum nitride) film.

Concerning the 2nd or subsequent layer, the Ta film 260 is deposited on the inter-layer insulating film 30 of SiO2 as in the diagram of FIG. 15 B also about the 1st layer, and the Cu wiring layer 270 deposits on the Ta film 260.

Thereby, the undersurface of the Ta film 260 will be exposed to the inter-layer insulating film 30 of SiO2. Thus, although Cu wiring layer is deposited on the Ta film instead of on the Ti film, compared with the Ti film, the Ta film has the small H2 absorption effect.

Therefore, compared with the case where the undersurface of Ti film is exposed to the inter-layer insulating film of SiO2, when the undersurface of Ta film is exposed to the inter-layer insulating film of SiO2, the bad influence which it has on H2 annealing is small.

Therefore, it can be said that it is suitable for CMOS image sensors. As for this, the same is said of the TaN film.

Figure 16:
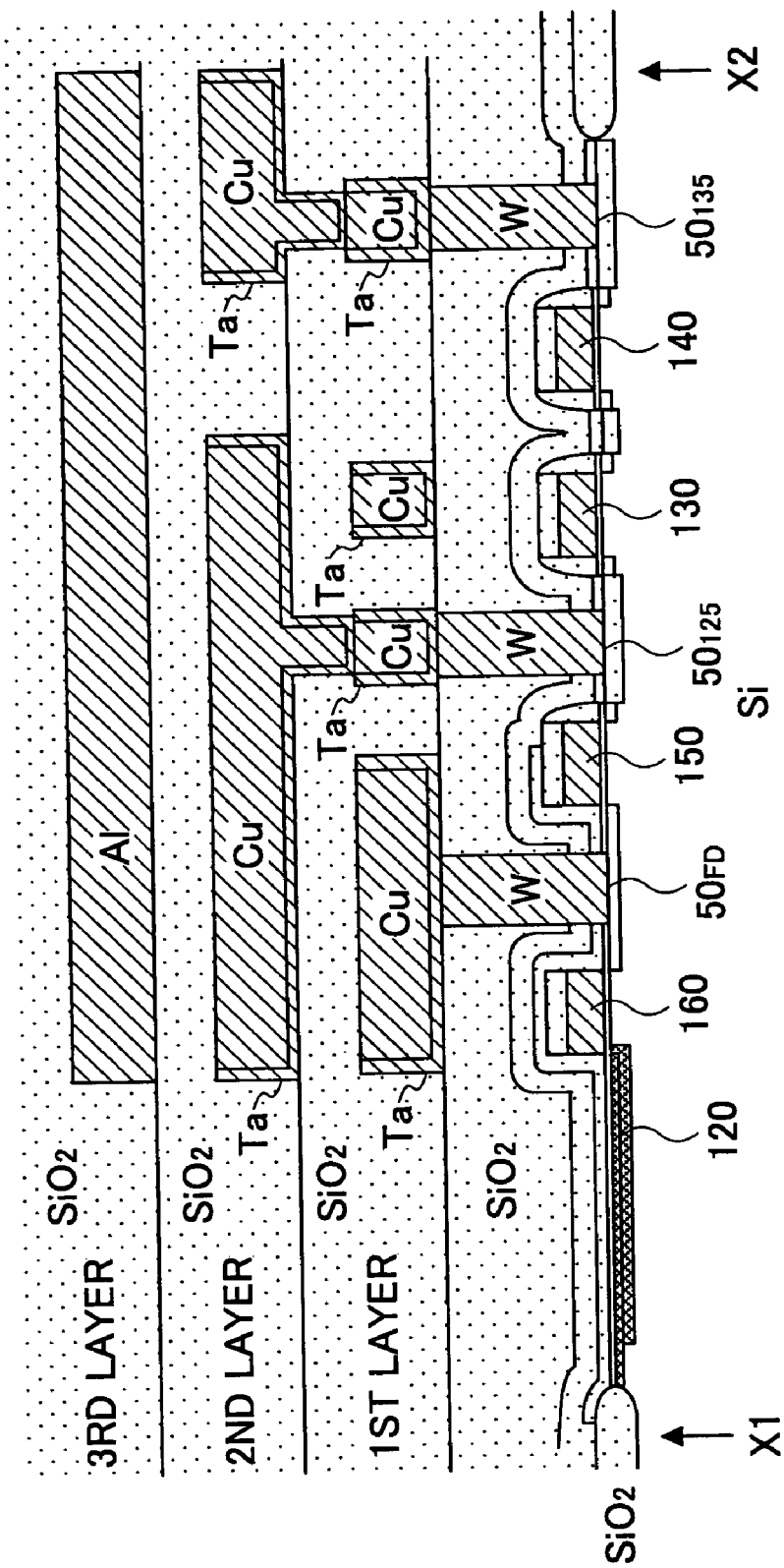
FIG. 16 is a side view of the CMOS image sensor in the 5th embodiment of the invention.

In addition, FIG. 16 is the side view of the CMOS image sensors concerning the 5th embodiment.

However, although the wiring structure of the 1st layer and the 2nd layer is the wiring structure which is explained as the 5th embodiment in FIG. 15, the wiring structure of the 3rd layer is the wiring structure which is explained by FIG. 4 as the 1st embodiment. Thus, it is possible to use together the two or more wiring structures of the 1st through 5th embodiments described above.

The present invention is not limited to the above-described embodiments, and variations and modifications may be made without departing from the scope of the present invention.

For example, the three transistor type and four transistor type CMOS image sensors have been explained in the above-described embodiments, but the present invention is applicable also to the five transistor type CMOS image sensors. In addition, the unit pixel of the five transistor type CMOS image sensors further comprises the overflow drain transistor used to remove the surplus charge, in addition to the photo diode, the source-follower transistor, the selection transistor, the reset transistor, and the transfer transistor.

What is claimed is:

1. A semiconductor device comprising:
    a plug layer which is embedded in a window penetrating a first inter-layer insulation film;
    a first titanium Ti film which is deposited on the plug layer and over first the inter-layer insulation film;
    a first titanium nitride TiN film which is deposited on the first titanium Ti film;
    a wiring layer which contains aluminum Al deposited on the first titanium nitride TiN film;
    an underlying film which is formed between the first inter-layer insulation layer and the first titanium Ti film;
    a second inter-layer insulation film which is in direct contact with the first inter-layer insulation film and provided to cover the wiring layer;
    a second titanium Ti film deposited on the wiring layer; and
    a second titanium nitride TiN film deposited on the second titanium Ti film.

2. The semiconductor device according to claim 1 wherein the underlying film is a titanium nitride TiN film or a silicon nitride SiN film.

3. The semiconductor device according to claim 1 wherein the underlying film is penetrated by the window.

4. The semiconductor device according to claim 1 wherein the underlying film is formed between the window and the plug layer.

5. The semiconductor device according to claim 1 wherein the underlying film is formed between the plug layer and the Ti film.

6. The semiconductor device according to claim 1 further comprising a titanium nitride TiN sidewall covering a side surface of the Ti film.

7. The semiconductor device according to claim 1 wherein the wiring layer is an uppermost wiring layer in a multi-layer wiring structure and the upper most wiring layer is used as a light shading layer.

8. The semiconductor device according to claim 1 wherein the semiconductor device is a CMOS image sensor.

9. A semiconductor device comprising:
a photo diode formed in a semiconductor substrate;
a first inter-layer insulation film on the semiconductor substrate;
a plug layer which is embedded in a window penetrating the first inter-layer insulation film;
a first Ti film which is deposited on the plug layer and over the first inter-layer insulation film;
a first TiN film which is deposited on the first Ti film;
a wiring layer which contains Al or Cu deposited on the first TiN film;
an underlying film which is formed between the first inter-layer insulation layer and the first Ti film;
a second inter-layer insulation film which is in direct contact with the first inter-layer insulation film and provided to cover the wiring layer;
a second Ti film deposited on the wiring layer; and
a second TiN film deposited on the second Ti film.

10. The semiconductor device according to claim 9, wherein the underlying film is a titanium nitride TiN film or a silicon nitride SiN film.

11. The semiconductor device according to claim 9, wherein the underlying film is penetrated by the window.

12. The semiconductor device according to claim 9, wherein the underlying film is formed between the window and the plug layer.

13. The semiconductor device according to claim 9, wherein the underlying film is formed between the plug layer and the Ti film.

14. The semiconductor device according to claim 9, further comprising a titanium nitride TiN sidewall covering a side surface of the Ti film.

15. The semiconductor device according to claim 9, wherein the wiring layer is an uppermost wiring layer or a lowermost wiring layer in a multi-layer wiring structure.

16. The semiconductor device according to claim 9, wherein the semiconductor device is a CMOS image sensor.

* * * * *